United States Patent
Ebuchi et al.

(10) Patent No.: US 6,853,223 B2
(45) Date of Patent: Feb. 8, 2005

(54) PHASE COMPARATOR AND CLOCK RECOVERY CIRCUIT

(75) Inventors: Tsuyoshi Ebuchi, Osaka (JP); Takefumi Yoshikawa, Osaka (JP); Toru Iwata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/345,994

(22) Filed: Jan. 17, 2003

(65) Prior Publication Data

US 2003/0169836 A1 Sep. 11, 2003

(30) Foreign Application Priority Data

Mar. 8, 2002 (JP) ...................................... 2002-064174

(51) Int. Cl.[7] .................................................. H03L 7/06
(52) U.S. Cl. ........................................... 327/156; 327/2
(58) Field of Search ................................ 327/1–3, 5–8, 327/156, 12, 158, 157; 375/376, 375

(56) References Cited

U.S. PATENT DOCUMENTS

| | | | |
|---|---|---|---|
| 4,754,235 A | 6/1988 | Fujiwara | 331/1 A |
| 5,432,481 A * | 7/1995 | Saito | 331/45 |
| 5,754,606 A | 5/1998 | Matsuyama et al. | 375/373 |
| 5,945,856 A | 8/1999 | Yanagiuchi | 327/159 |
| 6,211,741 B1 * | 4/2001 | Dalmia | 331/11 |
| 6,597,627 B2 * | 7/2003 | Arata et al. | 365/233 |
| 6,704,383 B2 * | 3/2004 | Lee et al. | 375/376 |

FOREIGN PATENT DOCUMENTS

| | | |
|---|---|---|
| JP | 01-309514 | 12/1989 |
| JP | 03-021119 | 1/1991 |
| JP | 06-343040 | 12/1994 |
| JP | 2000-354028 A | 12/2000 |
| JP | 2001-203570 A | 7/2001 |

* cited by examiner

*Primary Examiner*—Dinh T. Le
(74) *Attorney, Agent, or Firm*—McDermott Will & Emery LLP

(57) ABSTRACT

The present invention aims at providing a phase comparator and a clock recovery circuit suitable for applications that support data signals with high-speed bit rates in the order of one gigabit per second. Phase comparators receive frequency divided signals NHOLDH and NHOLDL generated from a data signal RD/NRD, respectively, and intermittently perform a phase comparison between a signal dDAT and a signal CLK. This increases the timing margin for the phase comparison and makes it possible to perform a phase comparison for high-speed bit rate signals. The provision of phase comparators that serve as clock recovery circuits makes it possible to handle data signals with high-speed bit rates in the order of one gigabit per second.

10 Claims, 16 Drawing Sheets

PHASE COMPARATOR AND CLOCK RECOVERY CIRCUIT

BACKGROUND OF THE INVENTION

The present invention relates to phase comparators and clock recovery circuits, and more particularly, to techniques of phase comparison and clock recovery for data signals with high-speed bit rates using a simple phase comparison system.

High-speed serial data transferring such as typified by IEEE (Institute of Electrical and Electronics Engineers) 1394b requires that the receiving side should reproduce a clock signal in accordance with the frequency and phase of a data signal from the sending side. For this operation, a clock recovery circuit is indispensable. One type of the architecture for such a clock recovery circuit is a simple phase comparison system that performs serial processing.

The simple phase comparison system is such that a data signal is input into a reference input of a PLL (Phase Locked Loop), and an input voltage to a voltage controlled oscillator (VCO) is controlled to match the phases of the data signal and a clock signal that has been fed back. This system has a simple configuration and a small-scale circuit area, which are very advantageous in cases in which the number of channels is large. However, the whole circuit needs to operate at the frequency of the bit rate of the data signal, and therefore, it is necessary to provide a phase comparator capable of high-speed operation.

FIG. 15 shows a circuit diagram of a conventional phase comparator. The conventional phase comparator comprises a phase comparator section 100 and a window generator section 1000.

The window generator section 1000 receives as input a signal INDATA and a comparison completion signal NR_WINDOW, and turns a comparison window signal NEN_PD to "L" according to the change of the signal INDATA when the comparison completion signal NR_WINDOW is at "H". The window generator section 1000 can operate in such a manner that the comparison window signal NEN_PD changes when a signal NPD given from a power down terminal is at "H".

The phase comparator section 100 receives the comparison window signal NEN_PD as input, and detects the phase difference (performs a phase comparison) between a data signal DATA_PD and a clock signal CLK_PD. The phase comparator section 100 is activated because the comparison window signal NEN_PD has changed to "L", and performs a phase comparison. As the result of the phase comparison, it outputs a signal UP and a signal DN. The phase difference is represented as the difference in the pulse widths between the signal UP and the signal DN. Upon completion of the phase comparison, the phase comparator section 100 turns the comparison completion signal NR_WINDOW to "L".

Next, the operation of the conventional phase comparator is described referring to the timing chart of FIG. 16. It is assumed here that the signal NPD is at "H".

At time t1, a rise of the signal INDATA occurs. In response to this, the window generator section 1000 turns the comparison window signal NEN_PD to "L" at time t2, on the condition that the comparison completion signal NR_WINDOW is at "H". The phase comparator section 100 is activated because the comparison window signal NEN_PD has changed to "L", and it detects a rise of the data signal DATA_PD at time t3 and outputs the signal UP at time t4. It also detects a rise of the clock signal CLK_PD at time t4 and outputs the signal DN at time t5.

Upon completion of the phase comparison, the phase comparator section 100 turns the comparison completion signal NR_WINDOW to "L" at time t6. Because the comparison completion signal NR_WINDOW becomes "L", the window generator section 1000 turns the comparison window signal NEN_PD to "H" at time t7. Because the comparison window signal NEN_PD becomes "H", the phase comparator section 100 is inactivated, thus stopping outputting of the signals UP and DN. As a result of this, the comparison completion signal NR_WINDOW becomes "H" at time t8. Then, at time t9, the next rise of the signal INDATA occurs, and thereafter, the same processing as described above is repeated.

The conventional phase comparator performs all the processes, which are the activation of the phase comparator section 100, the phase comparison, the transfer of the comparison completion signal NR_WINDOW to the window generator section 1000, and the inactivation of the phase comparator section 100, within one cycle period of the data signal. When the bit rate of the data signal is at low speed, it is possible to sequentially perform the phase comparison, as described above. However, when the bit rate is at high speed and in the order of one gigabit per second, the above-described phase comparison can cause problems.

The time required for the phase comparison fluctuates according to power supply voltages, temperatures, process conditions, and the like. Because of this, under certain conditions, there are cases that not all the above-described processes concerning the phase comparison can be completed within one cycle period of the data signal. If such cases arise, signal racing takes place between the signal INDATA indicating the timing of the phase comparison and the comparison completion signal NR_WINDOW, causing the phase comparator to operate abnormally.

SUMMARY OF THE INVENTION

In view of the foregoing and other problems, it is an object of the present invention to provide a phase comparator and a clock recovery circuit suitable for applications that support high-speed bit rates in the order of one gigabit per second.

More specifically, the present invention provides a phase comparator performing a phase comparison between a first signal and a second signal that are supplied thereto, wherein: the phase comparison is intermittently performed according to the logic level of a frequency divided signal from the first signal. In accordance with the present invention, the phase comparison between the first and the second signals is carried out according to the logic level of the frequency divided signal. That is, the phase comparison is carried out in accordance with the frequency of the frequency divided signal, which is longer than the frequency of the first signal. As a result, the phase comparison is intermittently, not sequentially, performed for the first signal. This makes it possible to increase the timing margin for the phase comparison and to achieve a phase comparator that is capable of supporting high-speed bit rates.

Preferably, the phase comparator comprises a phase comparator section performing the phase comparison by being activated and stopping the phase comparison by being inactivated; and a window generator section outputting a comparison window signal that controls switching between activating and inactivating of the phase comparator section. The window generator section receives as input the frequency divided signal, and sets the window comparison signal to such a state that the phase comparator section is inactivated when the frequency divided signal is at a predetermined logic level. With this configuration, when the frequency divided signal is at the predetermined logic level, the phase comparator section is inactivated by the window generator section. By being inactivated, the phase comparator section does not perform the phase comparison. This makes it possible to achieve a phase comparator that intermittently performs the phase comparison according to the logic level of the frequency divided signal.

Moreover, preferably in the present invention, the window generator section comprises an activating means that receives as input a frequency comparison signal indicating whether a frequency comparison between the first and the second signals is to be performed or not, and fixes the window comparison signal to such a state that the phase comparator section is activated when the frequency comparison signal indicates that the frequency comparison is to be performed. With this configuration, the comparison window signal is fixed by the activating means to be a state such that the phase comparator section is activated, and thereby, the phase comparator section is constantly kept in the activated state, so that it can function as a frequency comparator that compares the frequencies of the first and the second signals. Thus, for example, a clock recovery circuit provided with this phase comparator does not need to be provided with an additional frequency comparator, and the circuit area and cost can be reduced. It is also possible to reduce the time for circuit designing.

More preferably, in the present invention, the window generator section comprises a mask means that receives as input an intermittent comparison signal indicating whether the phase comparison is to be intermittently performed or not, and masks the frequency divided signal when the intermittent comparison signal indicates that the phase comparison is not to be performed intermittently. In this configuration, the frequency divided signal is masked by the mask means; therefore, the phase comparator does not become inactivated, and the phase comparison is sequentially performed. As a consequence, a phase comparator is achieved that can support a wide range of data signals with low bit rates as well as high bit rates.

Meanwhile, more specifically, the present invention provides a clock recovery circuit generating a clock signal from a supplied data signal, comprising: a frequency divided signal-generating means for generating a frequency divided signal from the data signal; and a phase comparator that receives as input the frequency divided signal, and intermittently performs a phase comparison between the data signal and the clock signal according to the logic level of the frequency divided signal. According to the present invention, the frequency divided signal-generating means generates the frequency divided signal from the data signal, and the phase comparator intermittently performs the phase comparison between the data signal and the clock signal according to the logic level of the frequency divided signal. This makes it possible to increase the timing margin for the phase comparison and to perform the phase comparison for data signals with high-speed bit rates. Accordingly, it becomes possible to achieve a clock recovery circuit that supports high-speed bit rates.

Preferably, in the above-described clock recovery circuit, the phase comparator receives as input a speed signal indicating the bit rate of the data signal, and selects whether the phase comparison is to be sequentially performed or to be intermittently performed according to the bit rate indicated by the speed signal. With this configuration, the phase comparator can select whether the phase comparison between the first signal and the second signal is to be sequentially performed or to be intermittently performed according to the bit rate of the data signal that is indicated by the speed signal. This configuration achieves a clock recovery circuit that can support a wide range of data signals with low-speed bit rates as well as high-speed bit rates. In addition, since the clock recovery circuit supports a wide range of bit rates, the degree of circuit designing increases.

Preferably, the clock recovery circuit may further comprises a charge pump circuit that receives as input a phase difference signal indicating the result of the phase comparison, and outputs a current having an amount that is determined based on the phase difference signal. The charge pump circuit receives as input a speed signal indicating the bit rate of the data signal, and changes the amount of the current according to the bit rate indicated by the speed signal. With this configuration, the amount of the current that is output from the charge pump circuit is changed according to the bit rate of the data signal indicated by the speed signal. Thus, the loop gain of the PLL in the clock recovery circuit can be kept constant.

Furthermore, it is preferable that the clock recovery circuit comprises a speed signal-generating means that compares the frequency of a supplied reference signal and the frequency of an internal signal of the clock recovery circuit, and generates the speed signal based on the result of the comparison. With this configuration, the frequency of the supplied reference signal and the frequency of the internal signal of the clock recovery circuit are compared by the speed signal-generating means, and the speed signal is generated based on the result of the comparison. As a result of this, in the clock recovery circuit, the terminal to which the speed signal is input from outside can be eliminated, the number of pads can be reduced, and circuit designing is facilitated.

Meanwhile, specifically, the present invention also provides a clock recovery circuit generating a clock signal from a supplied data signal, comprising: a frequency divided signal-generating means for generating a first frequency divided signal from the data signal and a second frequency divided signal whose phase is different from that of the first frequency divided signal; a first phase comparator receiving as input the first frequency divided signal, and intermittently performing a phase comparison between either one of a rising edge or a falling edge of the data signal and the clock signal according to the logic level of the first frequency divided signal; and a second phase comparator receiving as input the second frequency divided signal, and intermittently performing a phase comparison between the other one of the rising edge or the falling edge of the data signal and the clock signal according to the logic level of the second frequency divided signal. According to this configuration, the first phase comparator is intermittently performs the phase comparison between the rising (or falling) edge of the data signal and the clock signal according to the logic level of the first frequency divided signal, and at the same time, the second phase comparator intermittently performs the phase comparison between the falling (or rising) edge of the data signal and the clock signal according to the logic level of the second frequency divided signal. When the phase comparison is intermittently performed for only one of the rising edge or the falling edge, jitter resistance reduces. However, when the phase comparison is performed for both rising and falling edges of the data signal, the jitter resistance can be increased.

In addition, specifically, the present invention also provides a clock recovery circuit generating a clock signal from a supplied data signal, comprising: a frequency divided signal-generating means for generating a first frequency divided signal from the data signal and a second frequency divided signal whose phase is different from that of the first frequency divided signal; a first phase comparator receiving as input the first frequency divided signal, and intermittently performing a phase comparison between the data signal and the clock signal according to the logic level of the first frequency divided signal; and a second phase comparator receiving as input the second frequency divided signal, and intermittently performing a phase comparison between the data signal and the clock signal according to the logic level of the second frequency divided signal. In addition, the frequency divided signal-generating means generates the second frequency divided signal so that the timing of the phase comparison of the first phase comparator is shifted from the timing of the phase comparison of the second phase comparator. In accordance with the present invention, the first phase comparator intermittently performs the phase comparison between the data signal and the clock signal according to the logic level of the first frequency divided signal, and with timing shifted therefrom, the second phase comparator performs the phase comparison between the data signal and the clock signal according to the logic level of the second frequency divided signal. With this configuration, for example, by combining the first and the second phase comparators each of which intermittently performs the phase comparison according to the frequency divided signal obtained by dividing the frequency of the data signal by 2, the clock recovery circuit as a whole can sequentially performs the phase comparison. Therefore, it is possible to realize a clock recovery circuit that can support high-speed bit rates and has excellent jitter resistance since the number of times that the phase comparison is performed.

DETAILED DESCRIPTION OF THE INVENTION

Figure 1:
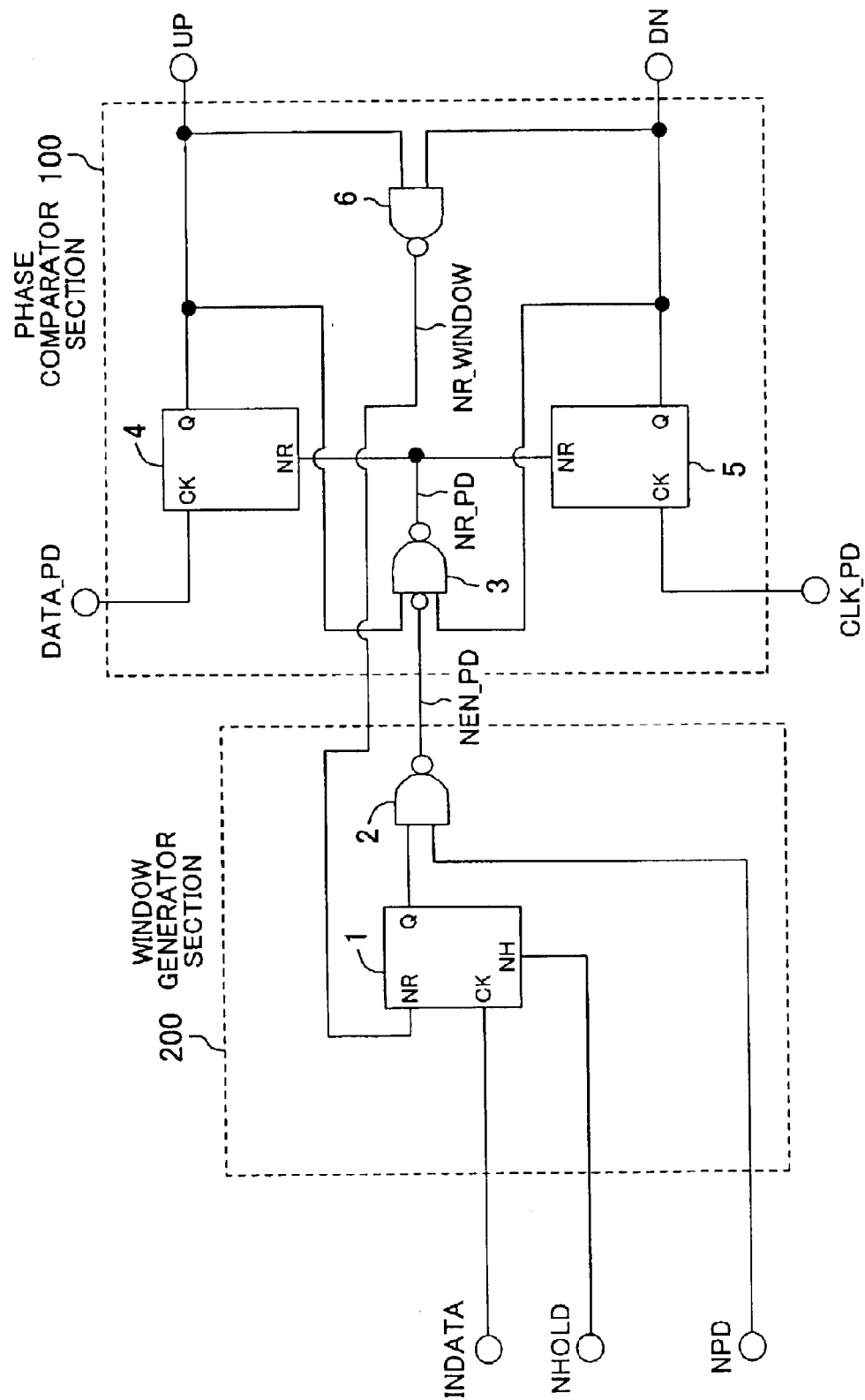
FIG. 1 is a circuit diagram showing a phase comparator according to Embodiment 1 of the present invention.

Hereinbelow, preferred embodiments of the present invention are described with reference to the drawings. In the description, some signals are represented by the same reference characters that denote terminals.

Embodiment 1

FIG. 1 shows a circuit diagram of a phase comparator according to Embodiment 1 of the present invention. The phase comparator according to the present embodiment comprises a phase comparator section 100 and a window generator section 200, and it intermittently performs a phase comparison between the rising edge of a data signal DATA_PD, which is a comparison subject, and the rising edge of a clock signal CLK_PD, which is another comparison subject. The result of the phase comparison is represented as the difference between the pulse width of a signal UP and a signal DN. It should be noted that the data signal DATA_PD and the clock signal CLK_PD correspond to the first signal and the second signal of the present invention, respectively.

Figure 2:
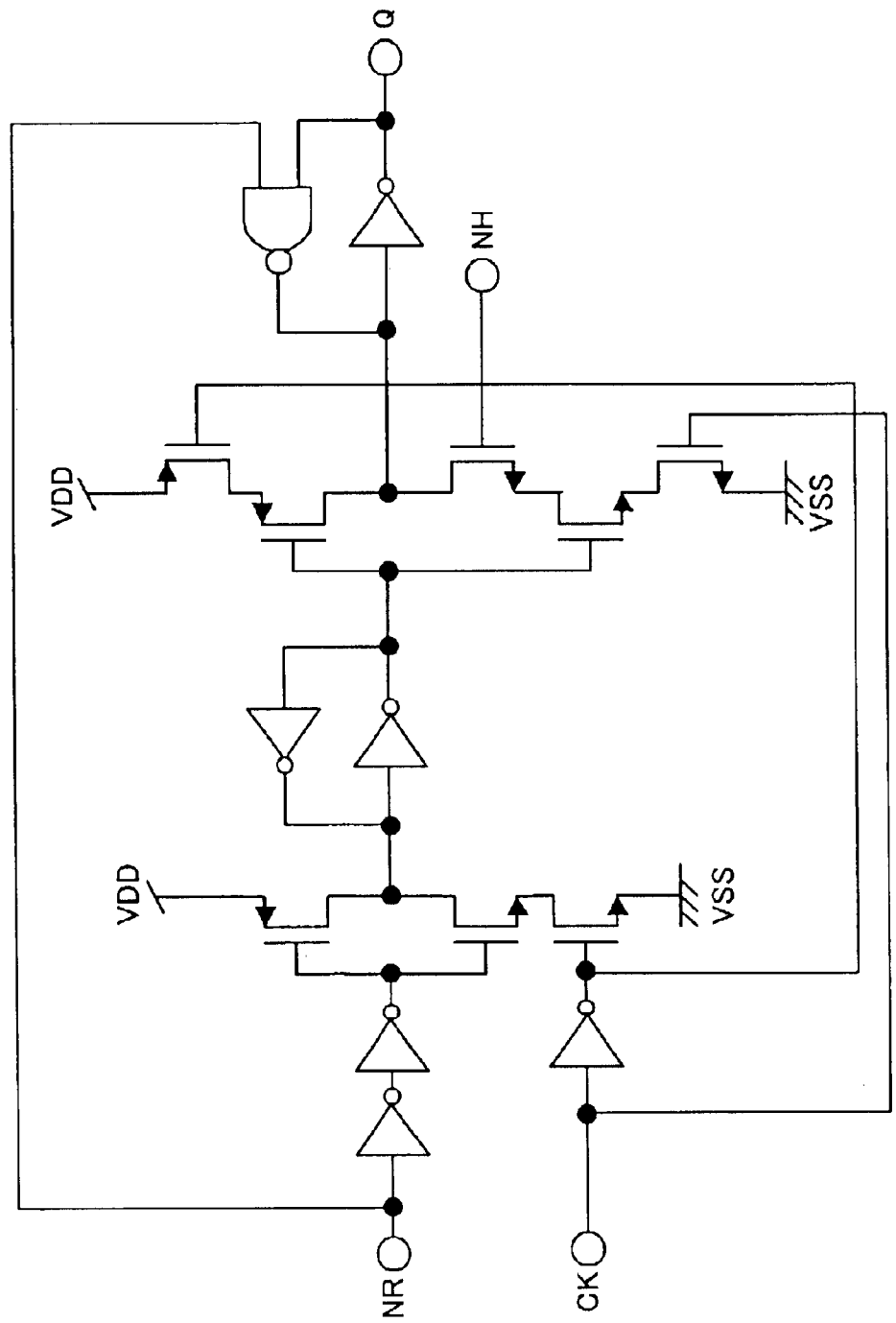
FIG. 2 is a circuit diagram showing a latch circuit in the window generator section of the phase comparator shown in FIG. 1.

The window generator section 200 is composed of a latch circuit 1 and a NAND circuit 2. In the latch circuit 1, a signal INDATA is input into an input CK; a signal INHOLD, which corresponds to the frequency divided signal of the present invention, is input into an input NH; and a comparison completion signal NR_WINDOW from the phase comparator section 100 is input into an input NR. The latch circuit 1 outputs a signal from an output Q according to the rise of the signal INDATA when both the comparison completion signal NR_WINDOW and the signal NHOLD are at "H". The latch circuit 1 can be realized by, for example, the circuit shown in FIG. 2.

The NAND circuit 2 outputs, as a comparison window signal NEN_PD, the NAND of an output signal from the latch circuit 1 and a signal NPD given to a power down terminal, to the phase comparator section 100. The comparison window signal NEN_PD is a signal for controlling switching between activating and inactivating of the phase comparator section 100. When it is at "L", the phase comparator section 100 is activated and is entered into the state in which the phase comparison can be performed. By contrast, when it is at "H", the phase comparator section 100 is inactivated and the phase comparison is not performed. Accordingly, when the signal NPD is at "L", the phase comparator section 100 is constantly in the state of being inactivated.

The phase comparator section 100 comprises NAND circuits 3 and 6, and latch circuits 4 and 5. The NAND circuit 3 outputs, as a signal NR_PD, the NAND of the NOT of the comparison window signal NEN_PD and the output signals from the latch circuits 4 and 5. In the latch circuit 4, the data signal DATA_PD is input to the input CK and the signal NR_PD is input to the input NR; then, it outputs the signal UP from the output Q in response to the rise of the data signal DATA_PD when the signal NR_PD is at "H". Likewise, in the latch circuit 5, the clock signal CLK_PD is input to the input CK and the signal NR_PD is input to the input NR; then, it outputs the signal DN from the output Q in response to the rise of the data signal CLK_PD when the signal NR_PD is at "H".

Figure 3:
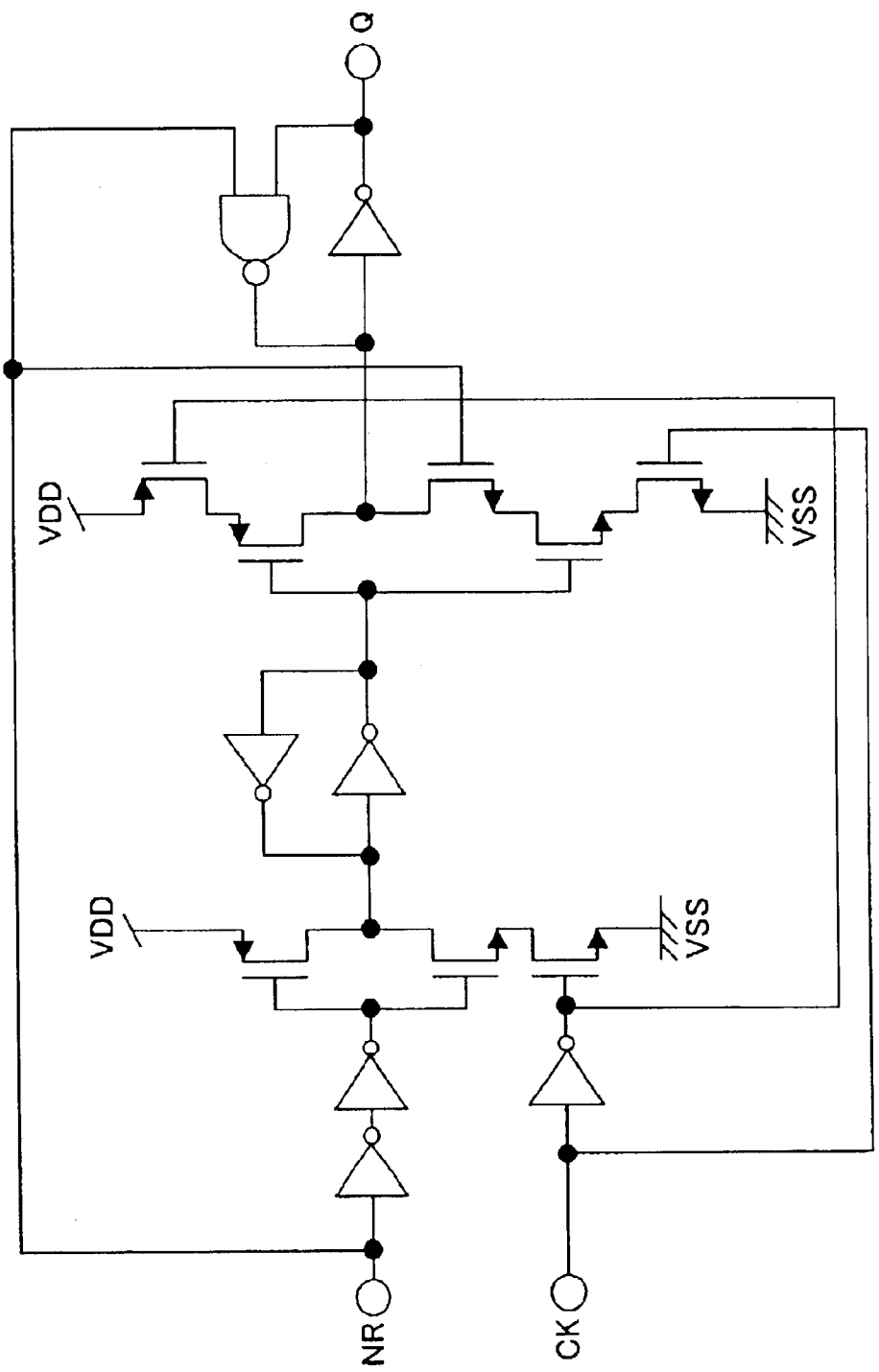
FIG. 3 is a circuit diagram showing a latch circuit in the phase comparator section of the phase comparator shown in FIG. 1.

When the signal NR_PD becomes "L", the latch circuits 4 and 5 are reset, and the phase comparison is completed. It should be noted that each of the latch circuit 4 and 5 can be realized by, for example, the circuit shown in FIG. 3.

The NAND circuit 6 outputs the NAND of the signal UP and the signal DN as the comparison completion signal NR_WINDOW to the window generator section 200. This comparison completion signal NR_WINDOW is a signal for closing the comparison window of the phase comparator section 100. Because this signal becomes "L", the latch circuit 1 in the window generator section 200 is reset. Thus, the comparison window signal NEN_PD changes into "H", and the phase comparator section 100 is made inactive.

Figure 4:
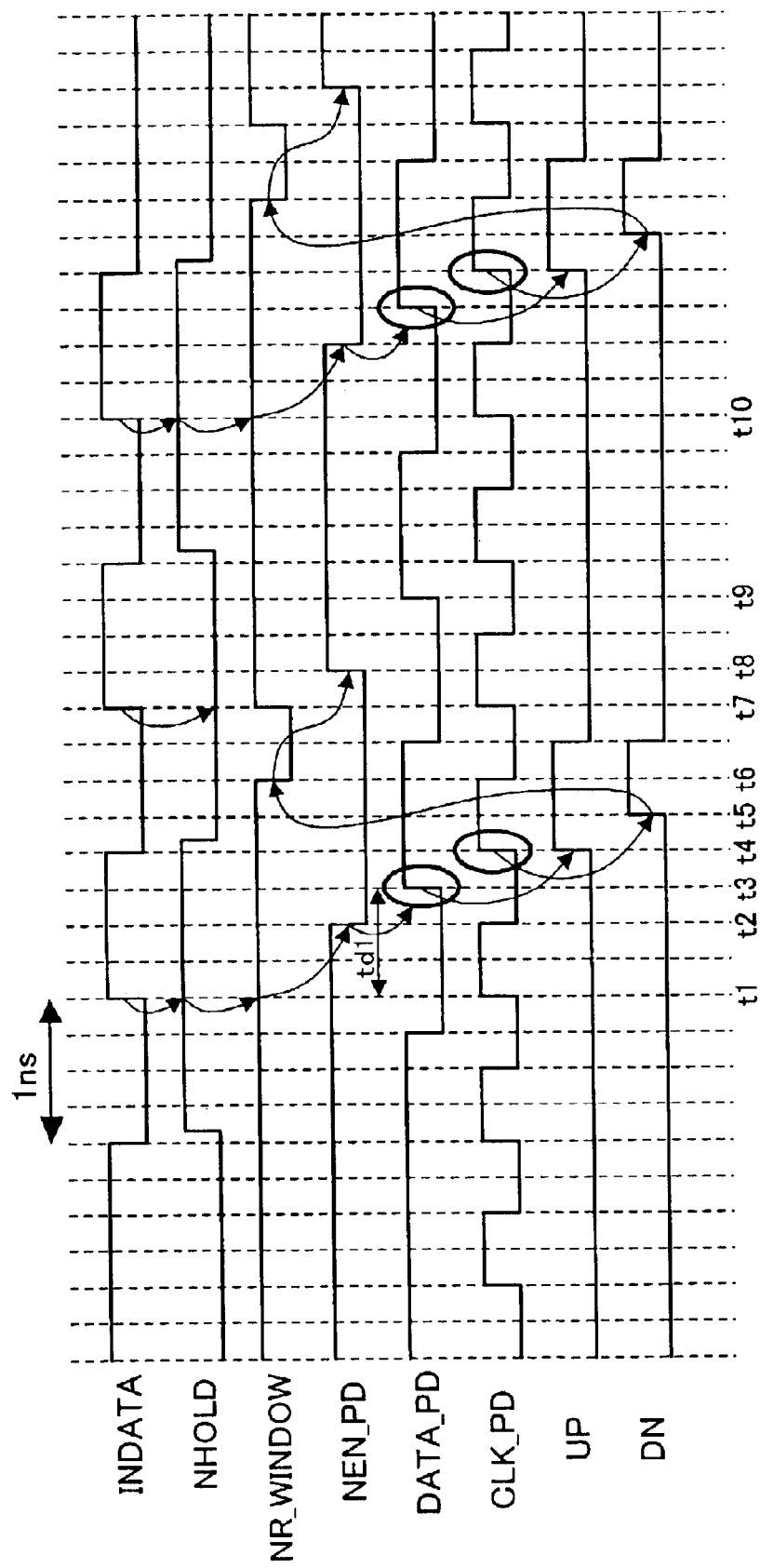
FIG. 4 is a timing chart illustrating the operation of the phase comparator shown in FIG. 1.

Next, the operation of the phase comparator according to the present embodiment is described with reference to the timing chart shown in FIG. 4. It is assumed that the phase comparator performs the phase comparison for a 1 Gbps data signal, and the minimum interval of the data signal edges (1 bit time) is 1 ns. The signal NPD is at "H".

Here, the signal NHOLD is a signal obtained by dividing the frequency of the inverted signal of the signal INDATA by 2. The data signal $DATA_{13}PD$ is a signal having a phase that is delayed from the signal INDATA by time td1 that corresponds to the difference between time t1 and time t3 in the figure. The time td1 is adjusted to be such a value obtained by adding up 500 ps (one half of 1 bit time), a delay time in the window generator section 200 (a delay in the latch circuit 1+a delay in the NAND circuit 2+a delay in the NAND circuit 3), and a set-up time of the latch circuit 4 (or 5) in the phase comparator section 100. The clock signal CLK_PD is an externally supplied 1 GHz clock signal.

First, at time t1, a rise of the signal INDATA occurs. At this time, since both the signal NHOLD and the comparison completion signal NR_WINDOW are at "H", a signal is output from the latch circuit 1. Then, at time t2, the comparison window signal NEN_PD that is at "L" is output from the window generator section 200. Because the comparison window signal NEN_PD becomes "L", the phase comparator section 100 is activated; then, it detects a rise of the data signal DATA_PD at time t3, which is after being activated, and outputs the signal UP at time t4. It also detects a rise of the clock signal CLK_PD at time t4, and it outputs the signal DN at time t5.

Next, since both signals UP and DN become "H", the NAND circuit 6 outputs the comparison completion signal NR_WINDOW that is at "L" at time t6. Because the comparison completion signal NR_WINDOW becomes "L", the comparison window signal NEN_PD becomes "H" at time t8, and the phase comparator section 100 is inactivated.

At time t7, the next rise of the signal INDATA occurs. However, since the signal NHOLD is at "L" at this time, no signal is output from the latch circuit 1 and consequently a new phase comparison process is not started. Therefore, even if the process of the phase comparison initiated by the rise of the signal INDATA at the time t1 does not finish within one cycle period of the signal INDATA and it drags on into the time t7 or later, the process does not overlap the next phase comparison.

Thus, according to the present embodiment, when the signal NHOLD is at a predetermined logic level (at "L" in the case of the above description), the phase comparator section 100 is inactivated. As a result of this, the phase comparison can be intermittently performed, and the timing margin for the phase comparison can be increased. Therefore, a phase comparator that supports high-speed bit rates can be realized.

It should be noted that although the signal NHOLD has been described to be a signal obtained by dividing the frequency of the inverted signal of the signal INDATA by 2, it may be other signals generated by other methods or obtained by dividing the frequency by 3 or greater. Also, the present embodiment describes a case in which the bit rate is 1 Gbps, but similar effects can be obtained at even higher bit rates according to the present invention.

Embodiment 2

Figure 5:
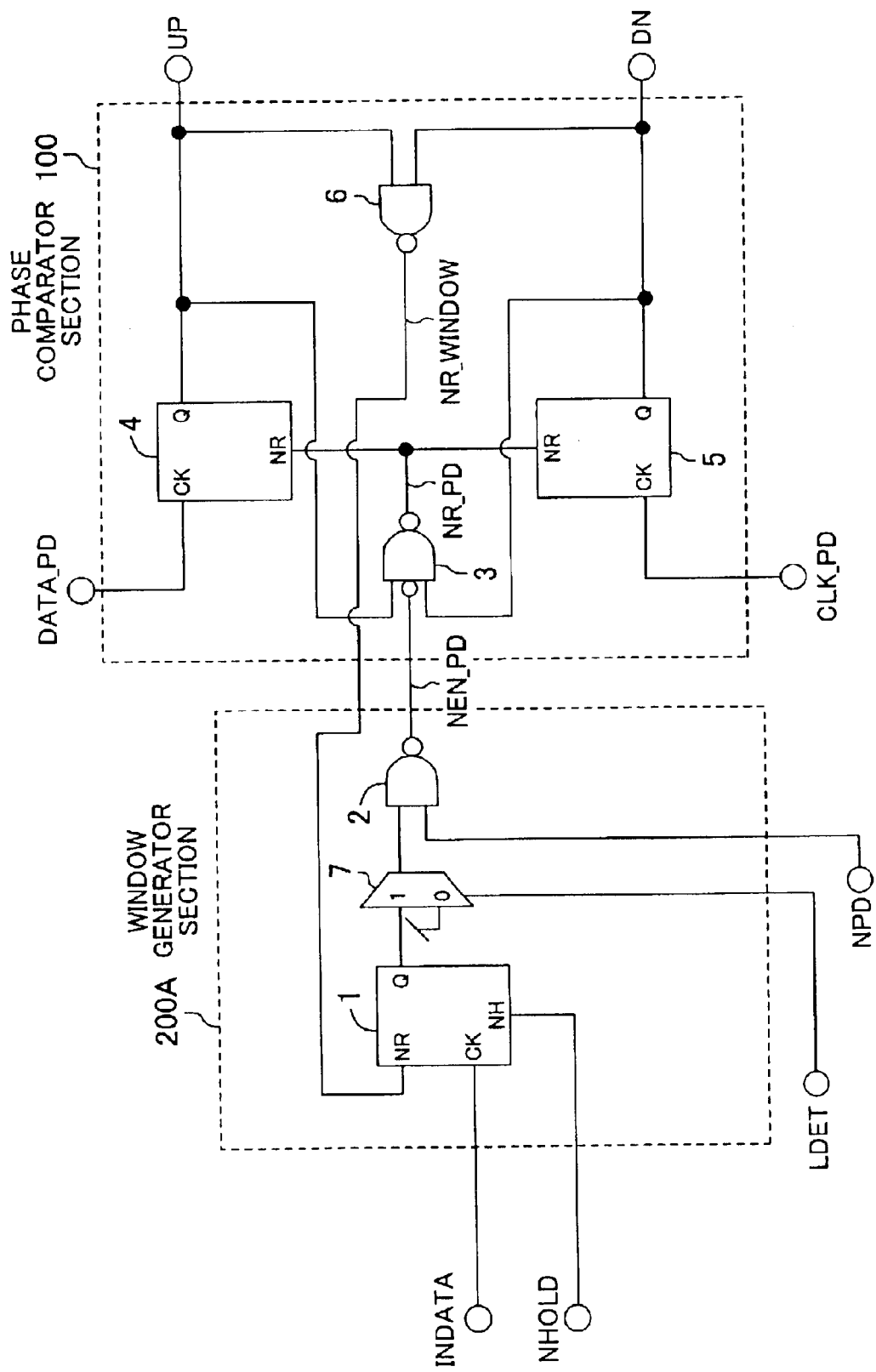
FIG. 5 is a circuit diagram of a phase comparator according to Embodiment 2 of the present invention.

FIG. 5 shows the circuit diagram of a phase comparator according to Embodiment 2 of the present invention. The phase comparator according to the present embodiment comprises a window generator section 200A having a selector circuit 7, which corresponds to the activating means of the present invention, between the latch circuit 1 and the NAND circuit 2 of the phase comparator shown in FIG. 1.

The selector circuit 7 receives as input a signal LDET, which corresponds to the frequency comparison signal of the present invention. It selects the input signal to the NAND circuit 2 according to the logic level of the signal LDET. More specifically, when the signal LDET is at "H", it inputs the output signal from the latch circuit 1 into the NAND circuit 2. By contrast, when it is at "L", the input to the NAND circuit 2 is fixed at "H".

When the signal LDET is at "H", the phase comparator according to the present embodiment is similar to the phase comparator according to Embodiment 1. On the other hand, when it is at "L", the comparison window signal NEN_PD is constantly fixed at "L" and, as a consequence, the phase comparator section 100 is constantly kept in the activated state. It should be noted that the signal NPD is always at "H".

The phase comparator section 100 performs the phase comparison for all the rising edges of the data signal DATA_PD and of the clock signal CLK_PD by entering into the constantly activated state. In other words, the phase comparator according to the present embodiment functions as a circuit similar to a frequency comparator.

Thus, according to the present embodiment, the selector circuit 7 determines whether the logic level of the comparison Window signal NEN_PD is to be fixed at "L" or not. When it is fixed at "L", the phase comparator can function as a frequency comparator. As a result of this, for example, it becomes unnecessary to additionally provide a frequency comparator in a clock recovery circuit comprising a phase comparator according to the present embodiment, and the circuit area and cost can be reduced. In addition, it is possible to reduce the time required for circuit designing.

In the present embodiment, the selector circuit 7, serving as the activating means of the present invention, is provided between the latch circuit 1 and the NAND circuit 2. However, the activating means is not limited to this. For example, it is possible to provide the selector circuit 7 at the output side of the NAND circuit 2, or it is possible to provide a logic circuit that incorporates both functions of the NAND circuit 2 and the selector circuit 7.

Embodiment 3

Figure 6:
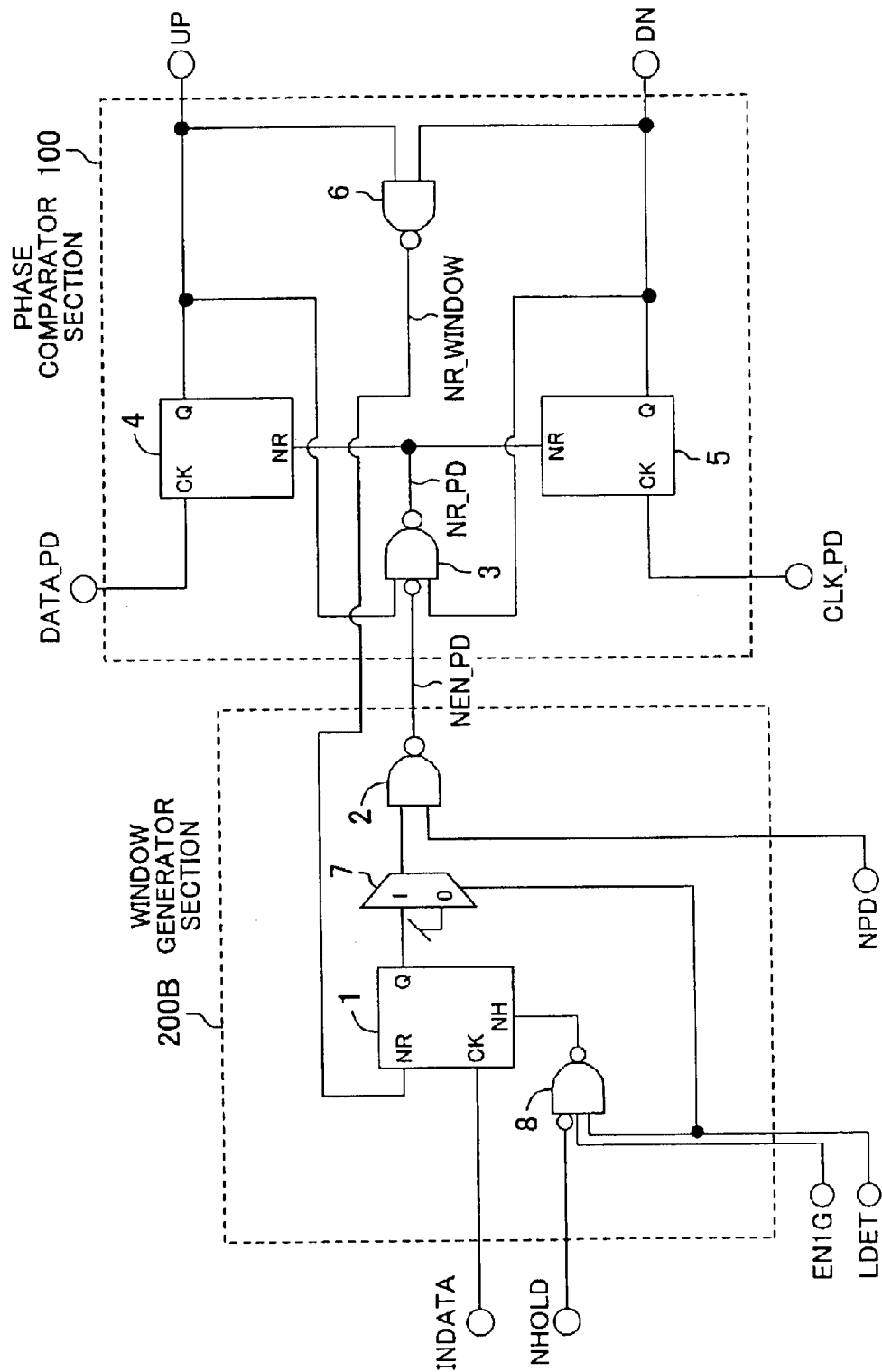
FIG. 6 is a circuit diagram of a phase comparator according to Embodiment 3 of the present invention.

FIG. 6 shows the circuit diagram of a phase comparator according to Embodiment 3 of the present invention. The phase comparator according to the present embodiment comprises a window generator section 200B having a NAND circuit 8, which corresponds to the mask means of the present invention, between the input NH of the latch circuit 1 and the terminal NHOLD in the phase comparator shown in FIG. 5.

The NAND circuit 8 receives as input a signal EN1G, which corresponds to the intermittent comparison signal of the present invention. In addition to this, it receives as input the NOT of the signal NHOLD and the signal LDET, and outputs the NAND of these to the input NH of the latch circuit 1.

Here, the data signal DATA_PD is assumed to be a signal according to IEEE 1394b. According to IEEE 1394b, the data rate can switch among 125 Mbps, 250 Mbps, 500 Mbps, and 1 Gbps. The signal EN1G is set to "H" only when the bit rate is 1 Gbps, but to "L" in the rest of times. Thus, when the bit rate is 1 Gbps, the signal EN1G becomes "H", and accordingly the output from the NAND circuit 8 has the same logic level as that of the signal NHOLD. On the other hand, when the bit rate is less than 1 Gbps, the signal EN1G becomes "L", and accordingly the output from the NAND circuit 8 is always at "H". That is, the signal NHOLD is masked. It should be noted that the signal LDET is at "H".

Thus, when the signal EN1G is at "H", the phase comparator according to the present embodiment intermittently performs the phase comparison according to the logic level of the signal NHOLD, as in Embodiments 1 and 2. On the other hand, when the signal EN1G is at "L", the phase comparator sequentially performs the phase comparison in a similar manner to the conventional phase comparator.

Thus, according to the present embodiment, the NAND circuit 8 masks the signal NHOLD, and as a consequence, the phase comparison between the data signal DATA_PD and the clock signal CLK_PD can be sequentially performed. This makes it possible to achieve a phase comparator that can support a wide range of data signals with low-speed bit rates as well as those with high-speed bit rates, allowing a greater degree of freedom in circuit designing.

It should be noted that the phase comparator according to the present embodiment is described to have the NAND circuit 8 serving as a mask means of the present invention. The mask means is, however, not limited thereto. For example, it is possible to mask the signal NHOLD according to the signal EN1G inside the latch circuit 1, and a completely different logic circuit may be employed to achieve this.

In addition, the phase comparator according to present embodiment is described to have the selector circuit 7, but this is not essential and may be omitted.

Embodiment 4

Figure 7:
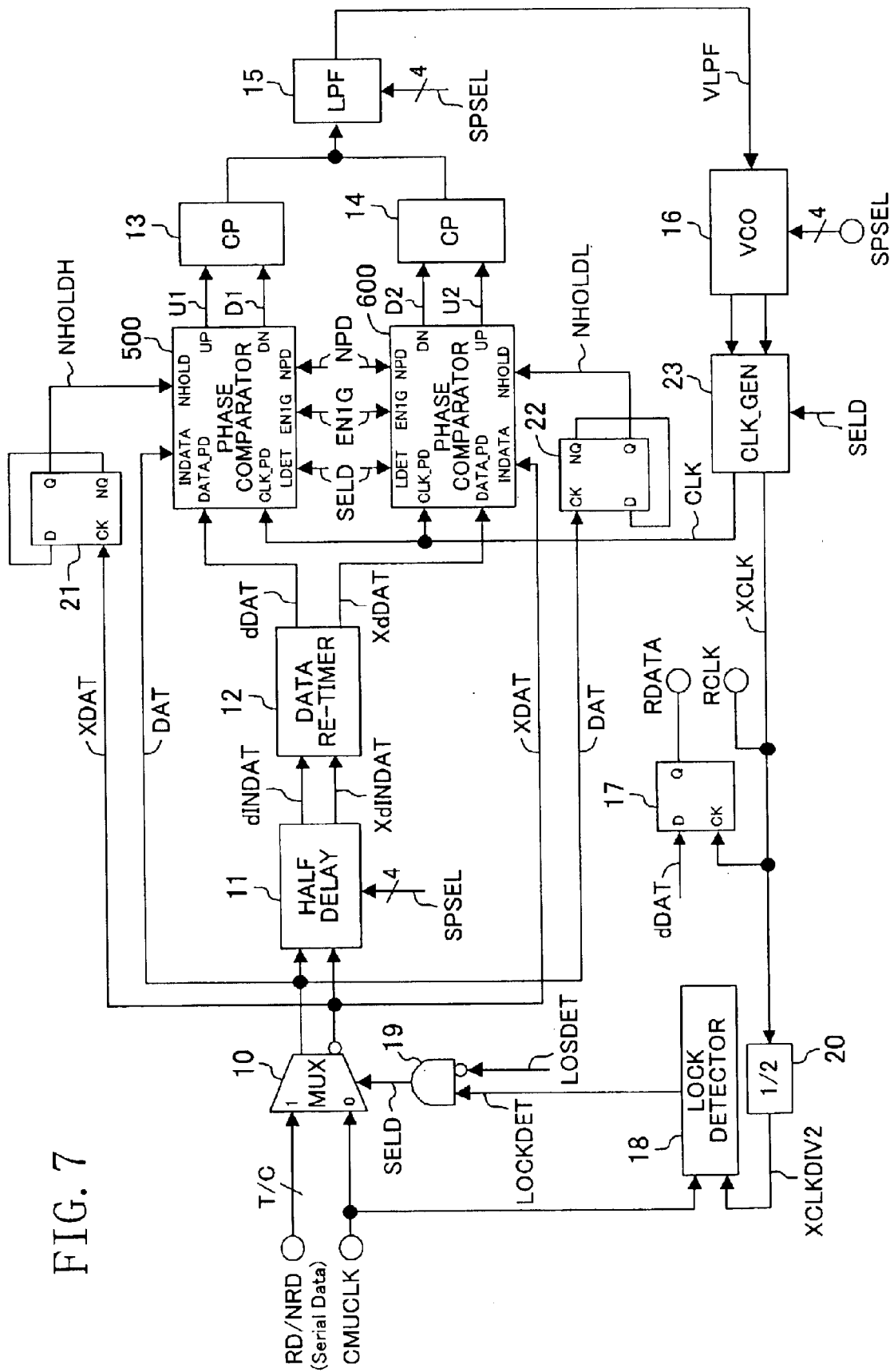
FIG. 7 is a circuit diagram of a clock recovery circuit according to Embodiment 4 of the present invention.

FIG. 7 shows the circuit diagram of a clock recovery circuit according to Embodiment 4 of the present invention. The clock recovery circuit according to the present embodiment comprises phase comparators 500 and 600, which correspond to the first and second phase comparators according to the present invention, receives as input a high-speed bit rate serial data signal RD/NRD, which corresponds to the data signal of the present invention, and generates clock signals CLK and XCLK from the data signal RD/NRD. It should be noted that phase comparators according to Embodiment 3 are employed for the phase comparators 500 and 600.

Hereafter, the constituting elements of the clock recovery circuit according to the present embodiment are explained.

A multiplexer (MUX) 10 selects which of the data signal RD/NRD or a reference signal CMUCLK is to be passed through based on an output signal SELD from an AND circuit 19, and it outputs a signal DAT and an inverted signal XDAT, which is an inverted signal of the signal DAT. It should be noted that the data signal RD/NRD is differential serial data in which the bit rate from the sending side is 1 Gbps. The signal CMUCLK is a 500 MHz reference clock from a PLL circuit of the sending side.

A delay circuit (HALF DELAY) 11 is a replica cell of a VCO 16. It delays the input signals DAT and XDAT by 0.5×UI (Unit Interval) and outputs them as signals dINDAT and XdINDAT. The amount of delay can be selected according to the bit rate indicated by a speed signal SPSEL.

Here, the speed signal SPSEL is discussed. The speed signal SPSEL is a 4-bit signal given from outside via a speed selecting terminal SPSEL, and the bit rate of the data signal RD/NRD is represented as (EN1G, EN500M, EN250M, EN125M). That is, (1, 0, 0, 0) represents 1 Gbps, (0, 1, 0, 0) represents 500 Mbps, (0, 0, 1, 0) represents 250 Mbps, and (0, 0, 0, 1) represents 125 Mbps.

More specifically, the delay circuit 11 changes the amount of delay according to the bit rate indicated by the speed signal SPSEL in such a manner that UI is 1 ns when the bit rate is 1 Gbps, UI is 2 ns when 500 Mbps, UI is 4 ns when 250 Mbps, and UI is 8 ns when 125 Mbps.

A data re-timing circuit (DATA RE-TIMER) 12 receives as input the signals dINDAT and XdINDAT, and outputs differential signals dDAT and XdDAT that have been subject to duty correction.

A charge pump (CP) 13 receives as input phase difference signals U1 and D1 that are output from the phase comparator 500, then converts the signals into a current to be output, and outputs the current. Likewise, charge pump (CP) 14 receives as input phase difference signals U2 and D2 that are output from the phase comparator 600, converts the signals into a current to be output, and outputs the current.

A loop filter (LPF) 15 is a low-pass filter comprising resistors and capacitors. It smoothes the current that is input from the CPs 13 and 14 and converts into a voltage VLPF to control the VCO 16. It should be noted that the impedance can be changed according to the bit rate indicated by the speed signal SPSEL.

A voltage controlled oscillator circuit (VCO) 16 controls the oscillation frequency with an input control voltage VLPF and outputs a clock signal. It should be noted that the oscillation frequency range can be changed according to the bit rate indicated by the speed signal SPSEL.

A latch circuit 17 receives as input the signal dDAT, and outputs a signal RDATA according to the signal XCLK that is output from CLK_GEN 23. The signal XCLK and the signal dDAT are in such a relationship that the phases are 90° shifted, and therefore, by latching the signal dDAT with the signal XCLK, the signal RDATA is recovered.

A lock detector circuit (LOCK DETECTOR) 18 detects whether the PLL in the clock recovery circuit has locked or not. If it detects that the PLL has been locked, it brings the signal LOCKDET to a predetermined signal level.

An AND circuit 19 receives as input the signal LOCKDET and the NOT of a signal LOSDET, and outputs the AND of these signals as a signal SELD. The signal LOSDET is a signal that indicates whether signals from the sending side are received or not, and it is supplied from an external detector circuit. When data signals are received, is it becomes "L", and when they are not received, it becomes "H".

A frequency divider (½) 20 divides the frequency of the signal XCLK by 2, and outputs it as a signal XCLKDIV2 to the lock detector circuit 18.

A flip-flop 21 corresponds to the frequency divided signal-generating means of the present invention. It divides the frequency of the input signal XDAT by 2, and outputs it as a signal NHOLDH, which corresponds to the first frequency divided signal of the present invention, to a NHOLD terminal of the phase comparator 500. Likewise, a flip-flop 22 corresponds to the frequency divided signal-generating means of the present invention. It divides the frequency of the input signal DAT by 2, and outputs it as a signal NHOLDL, which corresponds to the second frequency divided signal of the present invention, to a NHOLD terminal of the phase comparator 600.

A clock generator (CLK_GEN) 23 outputs the signals that are input from the VCO 16 as a clock signal CLK and an inverted signal XCLK, which is the inverted signal of the clock signal CLK. The clock signal CLK is output from a terminal RCLK to outside. When a signal SELD is at "L", it divides the frequency of the clocks from the VCO 16 by 2, whereas when the signal SELD is at "H", it outputs the clock signals CLK and XCLK without changing their frequencies.

A phase comparator 500 receives as input the signal DAT at a terminal INDATA, the signal NHOLDH at a terminal NHOLD, the signal dDAT at a terminal DATA_PD, and the signal CLK at a terminal CLK_PD, respectively. It intermittently performs a phase comparison between the rising edge of the signal dDAT and the rising edge of the signal CLK according to the logic level of the signal NHOLDH. Then, it outputs a signal U1 and a signal D1 from a terminal UP and a terminal DN, respectively, as the result of the comparison.

A phase comparator 600 receives the signal XDAT at a terminal INDATA, the signal NHOLDL at a terminal NHOLD, the signal XdDAT at a terminal DATA_PD, and the signal CLK at a terminal CLK_PD, respectively. It intermittently performs a phase comparison between the rising edge of the signal dDAT and the rising edge of the signal CLK according to the logic level of the signal NHOLDL. Then, it outputs a signal U2 and a signal D2 from a terminal UP and a terminal DN, respectively, as the result of the comparison.

The rising edge of the signal XdDAT corresponds to the falling edge of the signal dDAT. Consequently, the phase comparator 600 in effect performs the phase comparison between the falling edge of the signal dDAT and the rising edge of the signal CLK.

It should be noted that the phase comparators 500 and 600 receive as their input the signal SELD to a terminal LDET, the speed signal EN1G, which corresponds to the speed signal of the present invention, to the terminal EN1G, and the signal NPD to the terminal NPD, and they perform the operations and functions as described in Embodiment 3 above. The speed signal EN1G is, of the speed signals SPSEL, a 1-bit signal indicating that the bit rate is 1 Gbps.

Next, the description details the operation of a clock recovery circuit according to the present embodiment, which is configured as described above. It should be noted that the clock recovery circuit receives the signal from the sending side, and the signal LOSDET is at "L".

First, since PLL has not yet been locked, the signal LOCKDET is at "L". Accordingly, the signal SELD is at "L", and the signal CMUCLK is selected as the input to the clock recovery circuit by the MUX 10 (clock capture mode). Because the input signal SELD is at "L", the phase comparators 500 and 600 function as frequency comparators.

Since the phase comparators 500 and 600 function as frequency comparators, the clock recovery circuit operates so that the frequencies of the signals dDAT and XdDAT, which are input to the phase comparators 500 and 600, match the frequency of the signal CLK, to adjust the voltage VLPF. It should be noted that, at this time, the CLK_GEN 23 operates as a frequency divider because the input signal SELD is at "L". Accordingly, the VCO 16 oscillates at a frequency of 1 GHz.

When the lock detector circuit 18 detects that the PLL is locked, the signal LOCDET becomes "H". As a result of this, the output signal SELD from the AND circuit 19 becomes "H" and the data signal RD/NRD is selected by the MUX 10 as the input to the clock recovery circuit (phase comparison mode). Because the input signal SELD becomes "H", the phase comparators 500 and 600 function as phase comparators.

Figure 8:
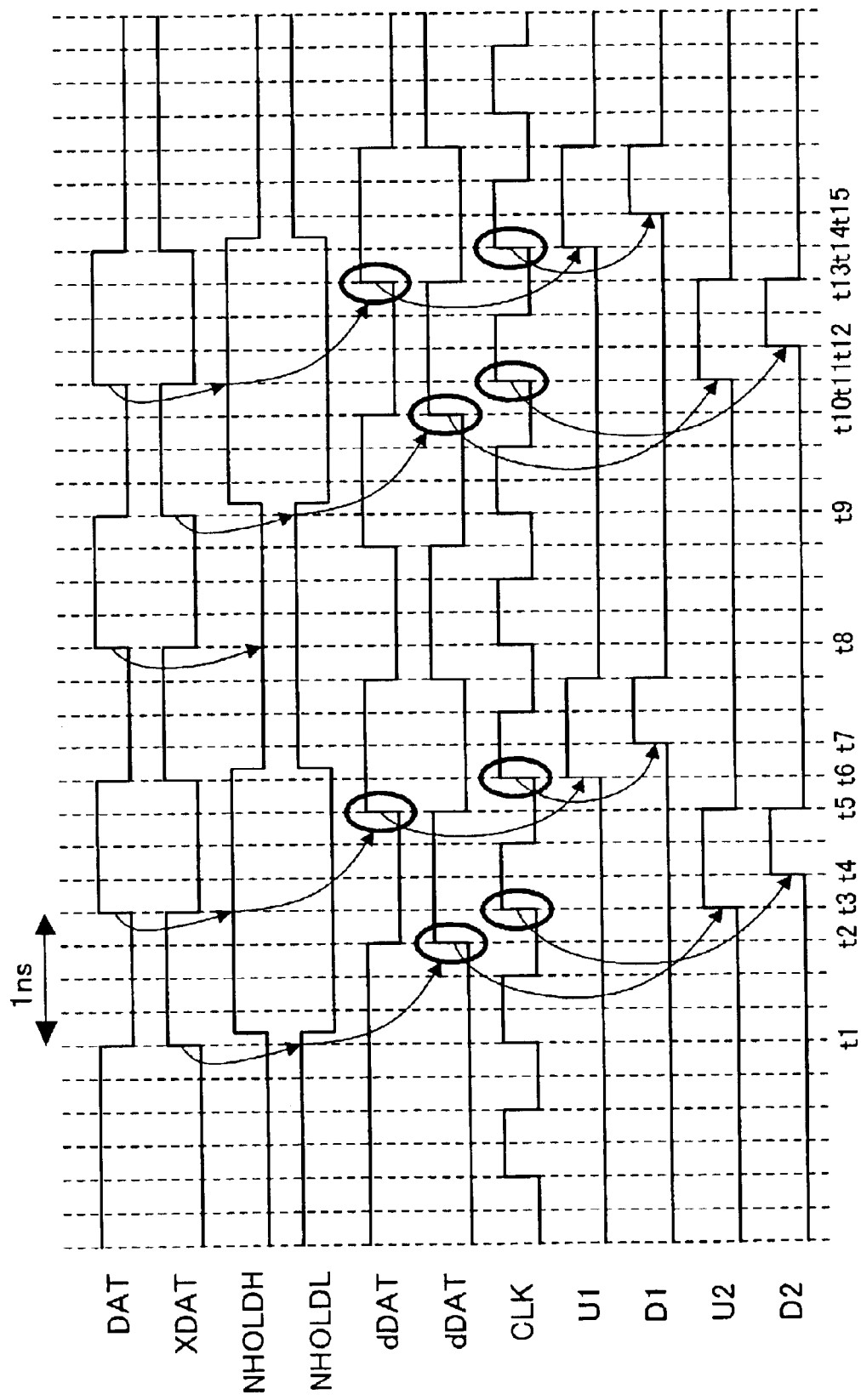
FIG. 8 is a timing chart illustrating the operation of the clock recovery circuit shown in FIG. 7.

Next, the operation of the clock recovery circuit according to the present embodiment in the phase comparison mode is described in detail with reference to the timing chart shown in FIG. 8.

At time t1, a rise of the signal XDAT occurs. At this time, because the input signal NHOLDL is at "H", the phase comparator 600 starts the phase comparison between the data signal XdDAT and the clock signal CLK. Then, it detects a rise of the data signal XdDAT at time t2 and outputs the signal U2 at time t3. It also detects a rise of the clock signal CLK also at time t3 and outputs the signal D2 at time t4.

In a similar manner, at time t3, a rise of the signal DAT occurs. At this time, because the input signal NHOLDH is at "H", the phase comparator 500 starts the phase comparison between the data signal dDAT and the clock signal CLK. Then, it detects a rise of the data signal dDAT at time t5 and outputs the signal U1 at time t6. It also detects a rise of the clock signal CLK also at time t6 and outputs the signal D1 at time t7.

At time t6, the next rise of the signal XDAT occurs. At this time, however, the signal NHOLDL is at "L", and therefore, the phase comparator 600 does not perform the phase comparison. Likewise, at time t8, the next rise of the signal DAT occurs; however, the signal NHOLDH is at "L", and therefore, the phase comparator 500 does not perform the phase comparison.

Subsequently, at time t9, the next rise of the signal XDAT occurs. At this time, since the signal NHOLDL is at "H", the phase comparator 600 performs the phase comparison between the data signal XdDAT and the clock signal CLK. Likewise, at time t11, the next rise of the signal DAT occurs. At this time, because the signal NHOLDH is at "H", the phase comparator 500 performs the phase comparison between the data signal dDAT and the clock signal CLK.

The above-described phase comparison operation is repeated until the phases of the data signals dDAT and XdDAT are locked. Then, upon the completion of the phase lock, recovered data signal DTATA and clock signal XCLK are output from the terminal RDATA and the terminal RCLK, respectively.

Thus, according to the present embodiment, it is made possible to perform the phase comparison between the rising and falling edges of the data signal dDAT and the clock signal CLK by providing the clock recovery circuit with two phase comparators 500 and 600 that intermittently perform the phase comparison. Thus, clock recovery of data signals with high-speed bit rates can be performed. Moreover, the phase comparison is performed for both rising and falling edges of the data signal dDAT, and therefore, a clock recovery circuit is achieved that also has excellent jitter resistance.

In addition, the phase comparators 500 and 600 intermittently perform the phase comparison when the bit rate is 1 Gbps but sequentially performs the phase comparison when the bit rate is less than 1 Gbps, according to the speed signal EN1G. With this configuration, a clock recovery circuit can be achieved that supports over a wide range of bit rates from low-speed bit rates to high-speed bit rates, and the degree of freedom in circuit designing can be increased.

It should be noted that the present embodiment describes that the phase comparators according to Embodiment 3 are used for the phase comparators 500 and 600, but it is possible to use phase comparators having other configurations.

Figure 9:
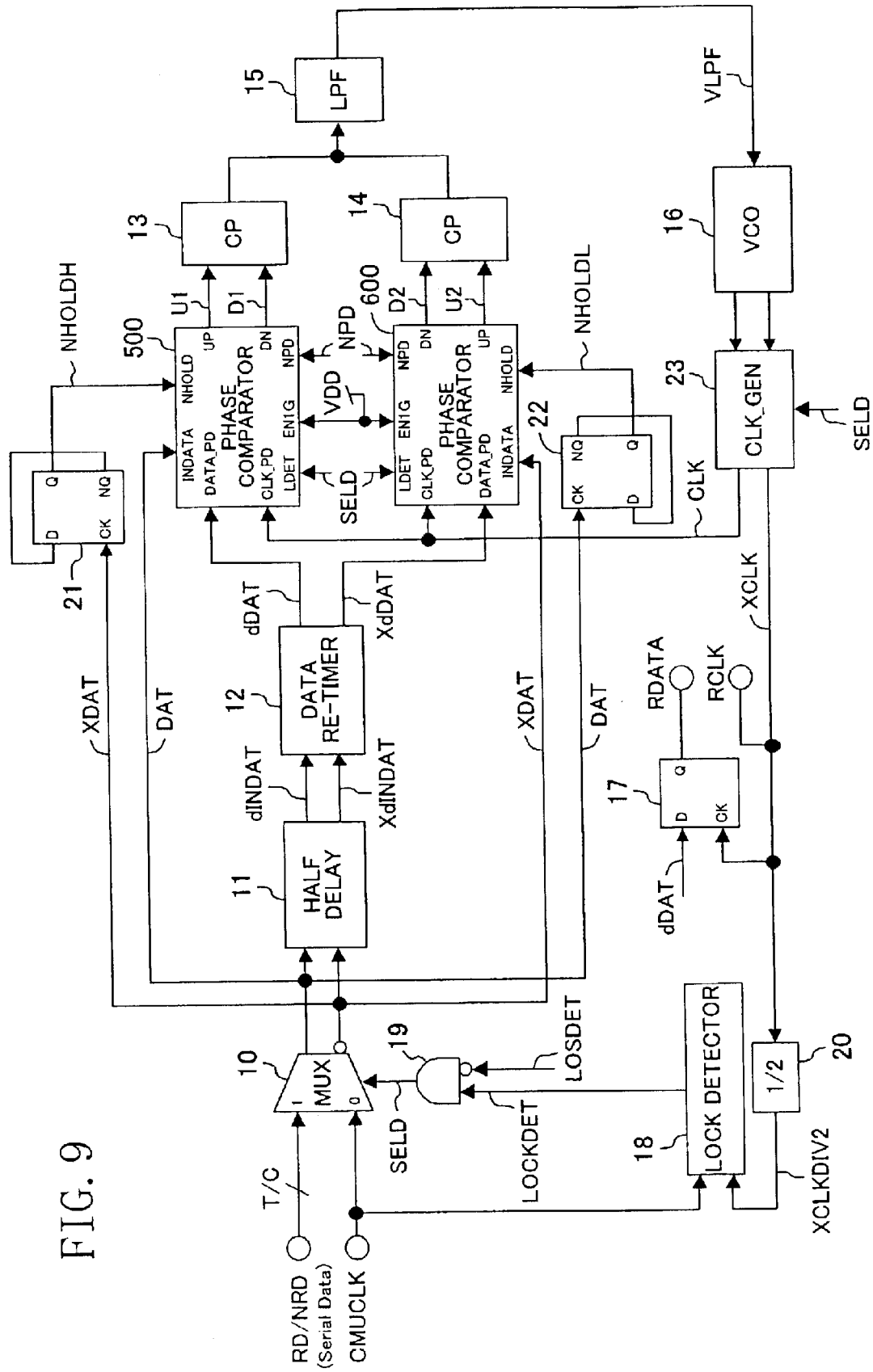
FIG. 9 is a circuit diagram of a clock recovery circuit which is similar to the circuit shown in FIG. 7, but in which the speed signal is omitted.

In addition, the provision of the speed signal SPSEL is not essential. By configuring the phase comparators 500 and 600 so that the phase comparison with the phase comparators 500 and 600 is always intermittently performed regardless of the bit rate, it is possible to achieve a clock recovery circuit that supports data signals with high-speed bit rates. Such a clock recovery circuit is represented by, for example, the circuit diagram shown in FIG. 9. Here, a signal VDD is input so that the signal level "H" is always input to the terminals EN1G.

Figure 10:
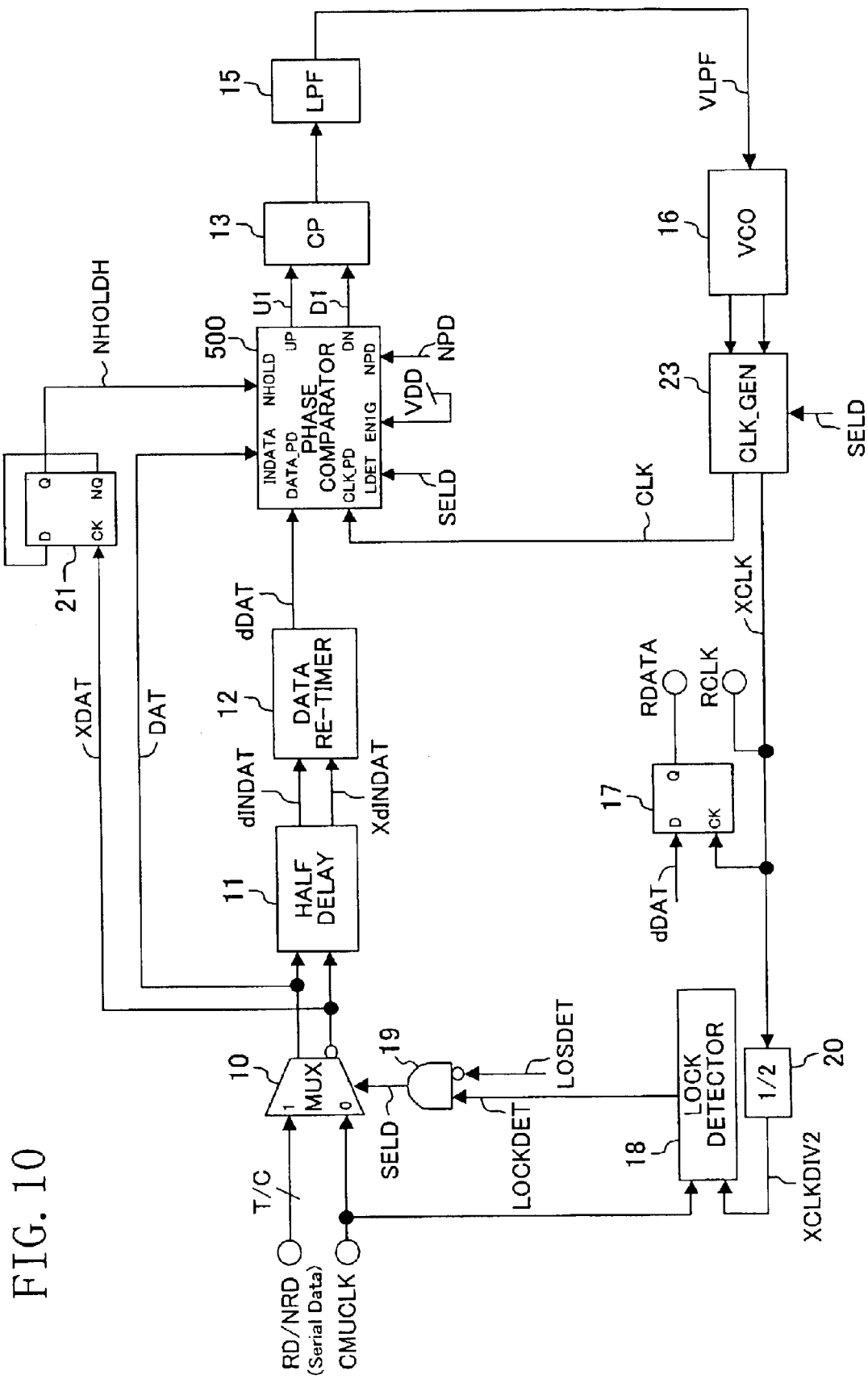
FIG. 10 is a circuit diagram of a clock recovery circuit which is similar to the circuit shown in FIG. 7, but in which only one phase comparator is provided.

Furthermore, it is not always necessary to provide two phase comparators 500 and 600. Even when either one of the phase comparators 500 or 600 is omitted, although the jitter resistance may be somewhat reduced, it is possible to provide a clock recovery circuit that can support data signals with high-speed bit rates. Such a clock recovery circuit is represented by, for example, the circuit diagram shown in FIG. 10. The clock recovery circuit shown in the figure is such that the phase comparator 600 is omitted from the clock recovery circuit shown in FIG. 9.

Embodiment 5

Figure 11:
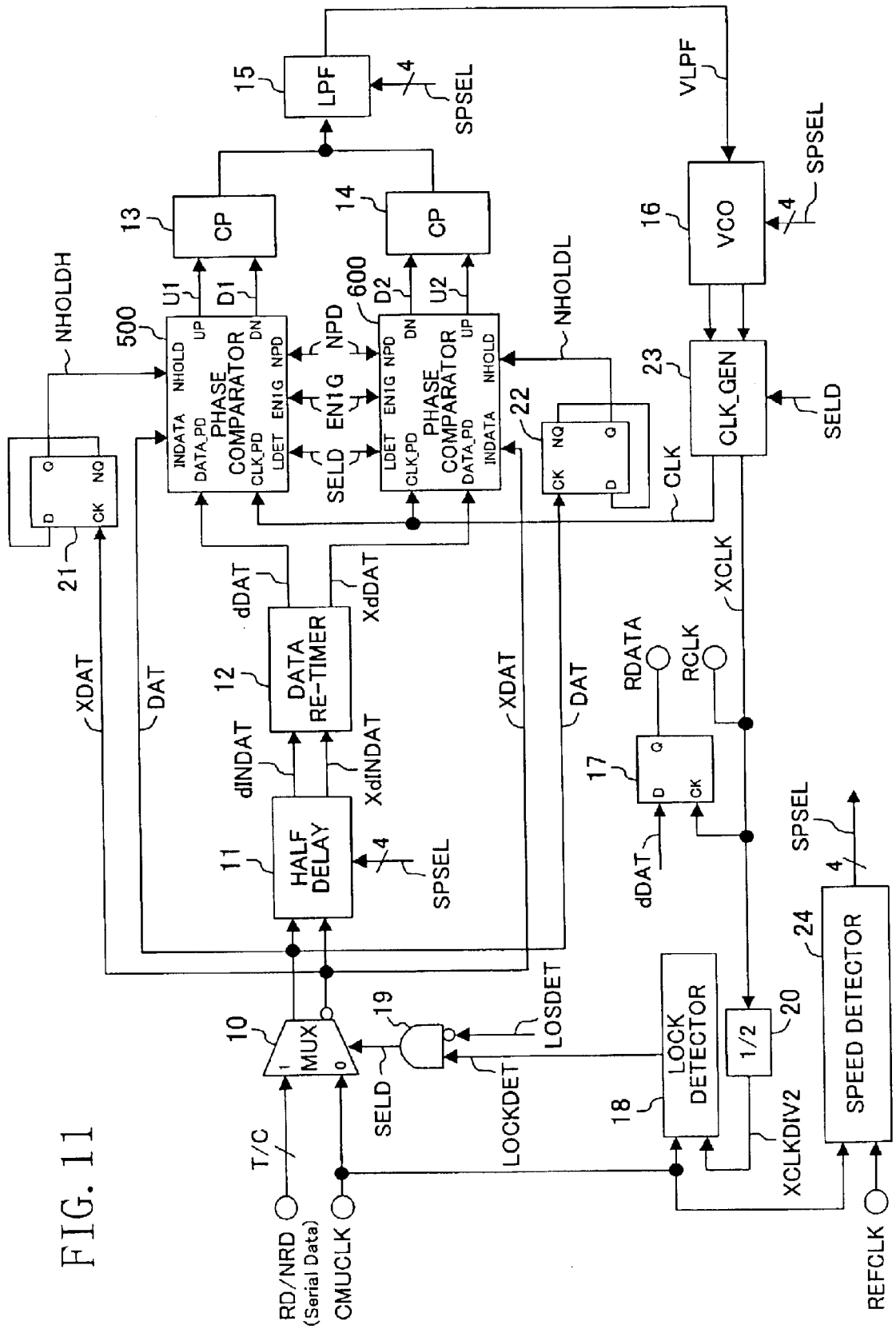
FIG. 11 is a circuit diagram of a clock recovery circuit according to Embodiment 5 of the present invention

FIG. 11 shows the circuit diagram of a clock recovery circuit according to Embodiment 5 of the present invention. The clock recovery circuit according to the present embodiment has a frequency detector circuit (SPEED DETECTOR) 24, which corresponds to the speed signal generating-means of the present invention, in addition to the configuration of the clock recovery circuit shown in FIG. 7.

The frequency detector circuit 24 compares the frequency of the signal CMUCLK, which corresponds to the reference signal of the present invention, and the frequency of a signal REFCLK, which corresponds to the internal signal of the present invention. Then, based on the result of the comparison, it generates the speed signal SPSEL. The signal REFCLK is a signal that is supplied inside the clock recovery circuit, and its frequency is from 62.5 MHz to 500 MHz.

More specifically, as a result of the frequency comparison, the frequency detector circuit 24 outputs (1, 0, 0, 0) when the frequency of the signal CMUCLK is equal to or higher than the frequency of the signal REFCLK, whereas it outputs (0, 0, 0, 1) when the frequency of the signal REFCLK is higher. In brief, the bit rate is selected from one of 1 Gbps or 125 Mbps.

Thus, according to the present embodiment, the speed signal SPSEL is generated by the frequency detector circuit 24. As a result of this, the selection of bit rate is automated. In addition, the terminal to which the speed signal SPSEL is input from outside can be eliminated, the number of pads can be reduced, and circuit designing is facilitated.

The present embodiment has described that the frequency detector circuit 24 selects the bit rate from either 1 Gbps or 125 Mbps, but it is possible that the bit rate is selected from one of 1 Gbps, 500 Mbps, 250 Mbps, and 125 Mbps. It is also possible to select bit rates other than these bit rates.

Embodiment 6

Figure 12:
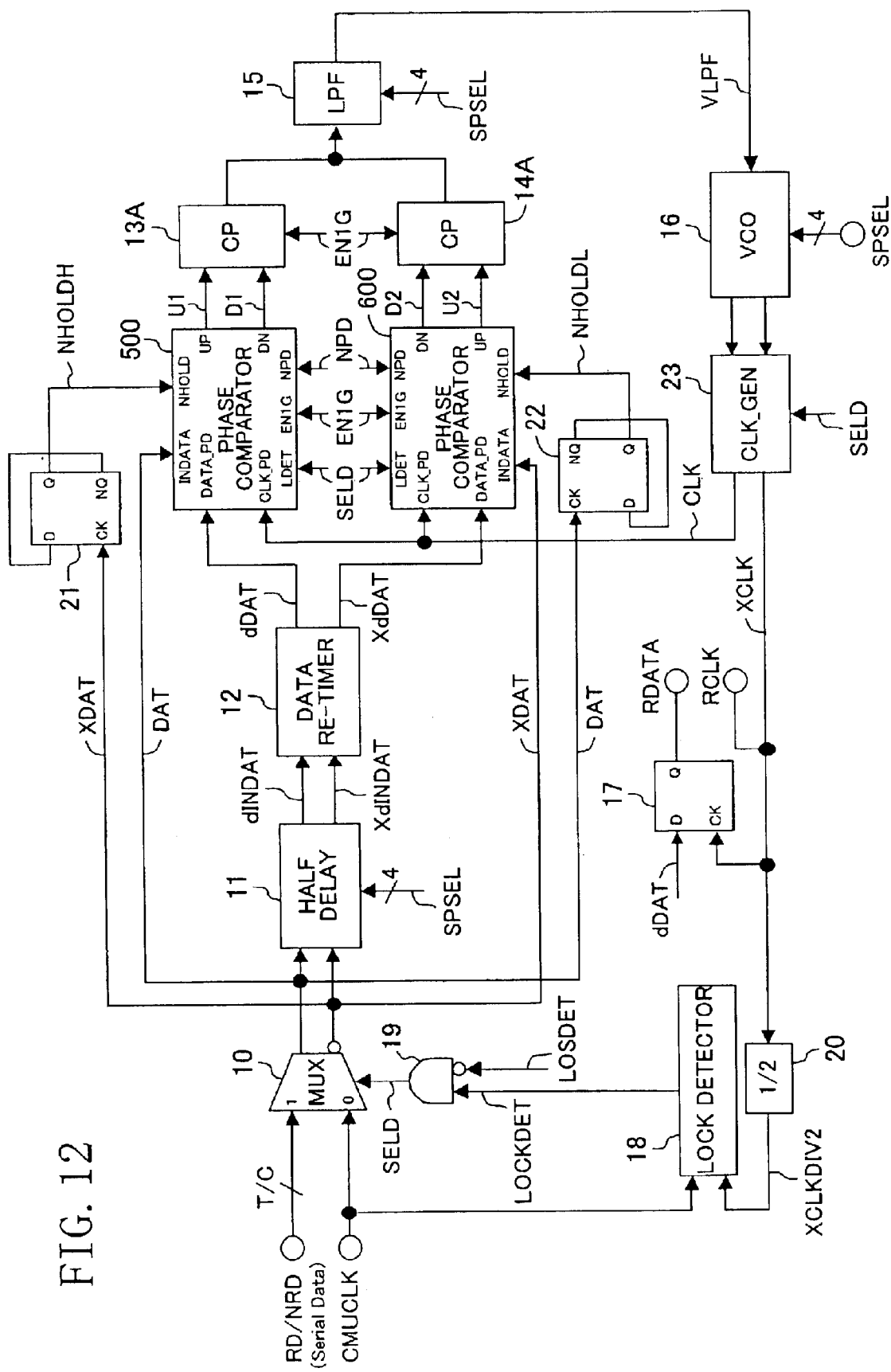
FIG. 12 is a circuit diagram of a clock recovery circuit according to Embodiment 6 of the present invention

FIG. 12 shows the circuit diagram of a clock recovery circuit according to Embodiment 6 of the present invention. In place of the CPs 13 and 14 in the clock recovery circuit shown in FIG. 7, the clock recovery circuit according to the present embodiment comprises CPs 13A and 14A to which a speed signal EN1G can be input.

The CPs 13A and 14A change the amount of the output current to be twice as much when the speed signal EN1G that is input thereto is at "H". When the bit rate is 1 Gbps, the loop gain becomes ½ because the phase comparison is intermittently performed by the phase comparators 500 and 600. In view of this, when the speed signal EN1G indicates that the bit rate is 1 Gbps, the amount of the current that is output from the CP 13A and 14A is made twice as much to keep the loop gain constant.

Thus, according to the present embodiment, the amount of current that is output from the CPs 13A and 14A is changed according to the bit rate indicated by the speed signal EN1G. As a result of this, the loop gain of the PLL in the clock recovery circuit can be kept constant.

Embodiment 7

Figure 13:
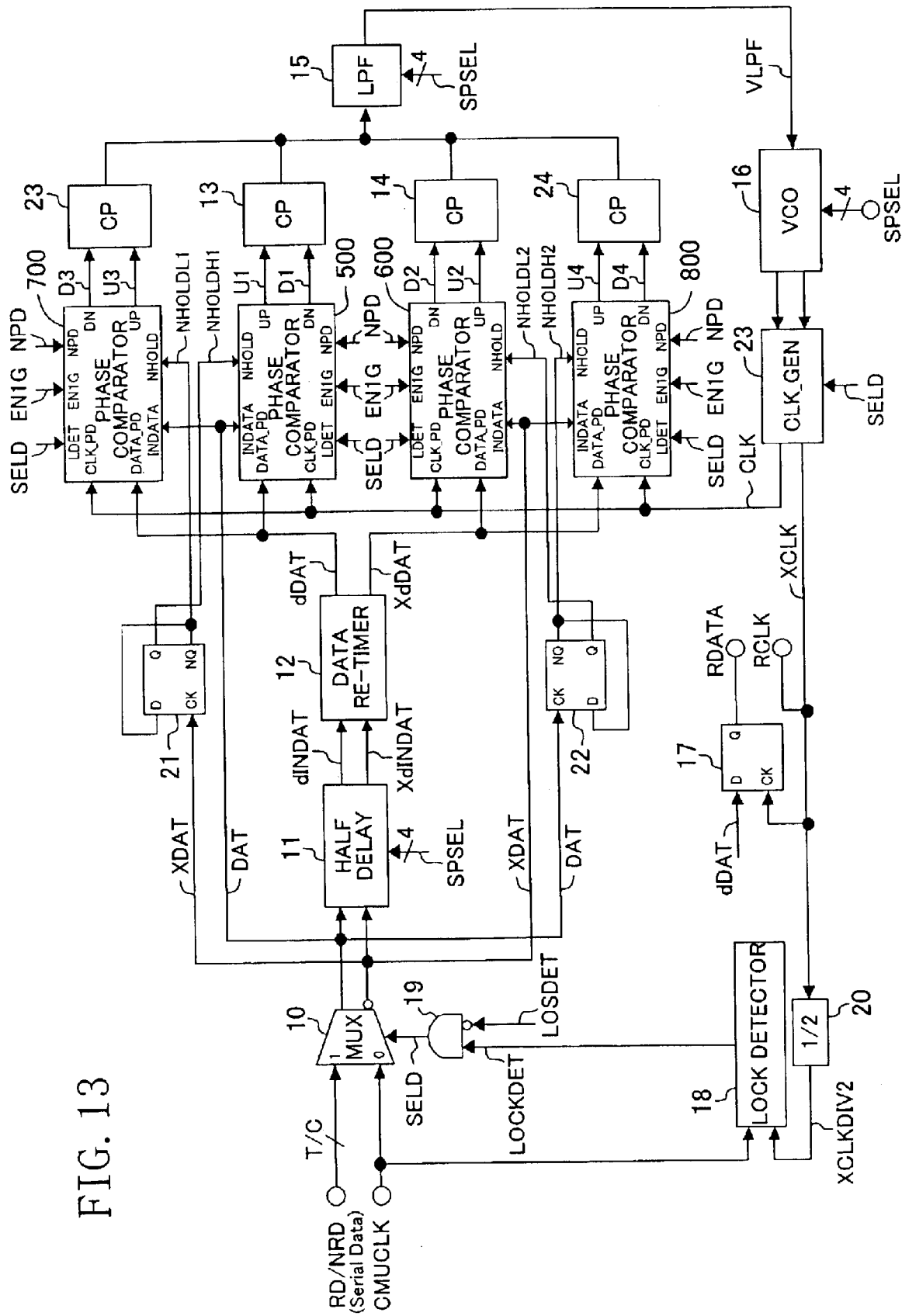
FIG. 13 is a circuit diagram of a clock recovery circuit according to Embodiment 7 of the present invention

FIG. 13 shows the circuit diagram of a clock recovery circuit according to Embodiment 7 of the present invention. The clock recovery circuit according to the present embodiment has a phase comparator 700, which corresponds to the second phase comparator of the present invention; a phase comparator 800, which corresponds to the first phase comparator; and CPs 25 and 26, in addition to the configuration of the clock recovery circuit shown in FIG. 7.

Like the phase comparator 500, the phase comparator 700 receives the signal dDAT, the signal CLK, and the signal DAT as its input, and performs the phase comparison. However, an inverted signal NHOLDL1, which is the inverted signal of the signal NHOLDH1 that is input to the phase comparator 500, is input to the terminal NHOLD. The signal NHOLDL1 becomes "H" (or "L") when the signal NHOLDH1 is "L" (or "H"). As a consequence, the phase comparators 500 and 700 alternately performs the phase comparison between the rising edge of the signal dDAT and the rising edge of the signal CLK (performs interleaving comparison).

Figure 14:
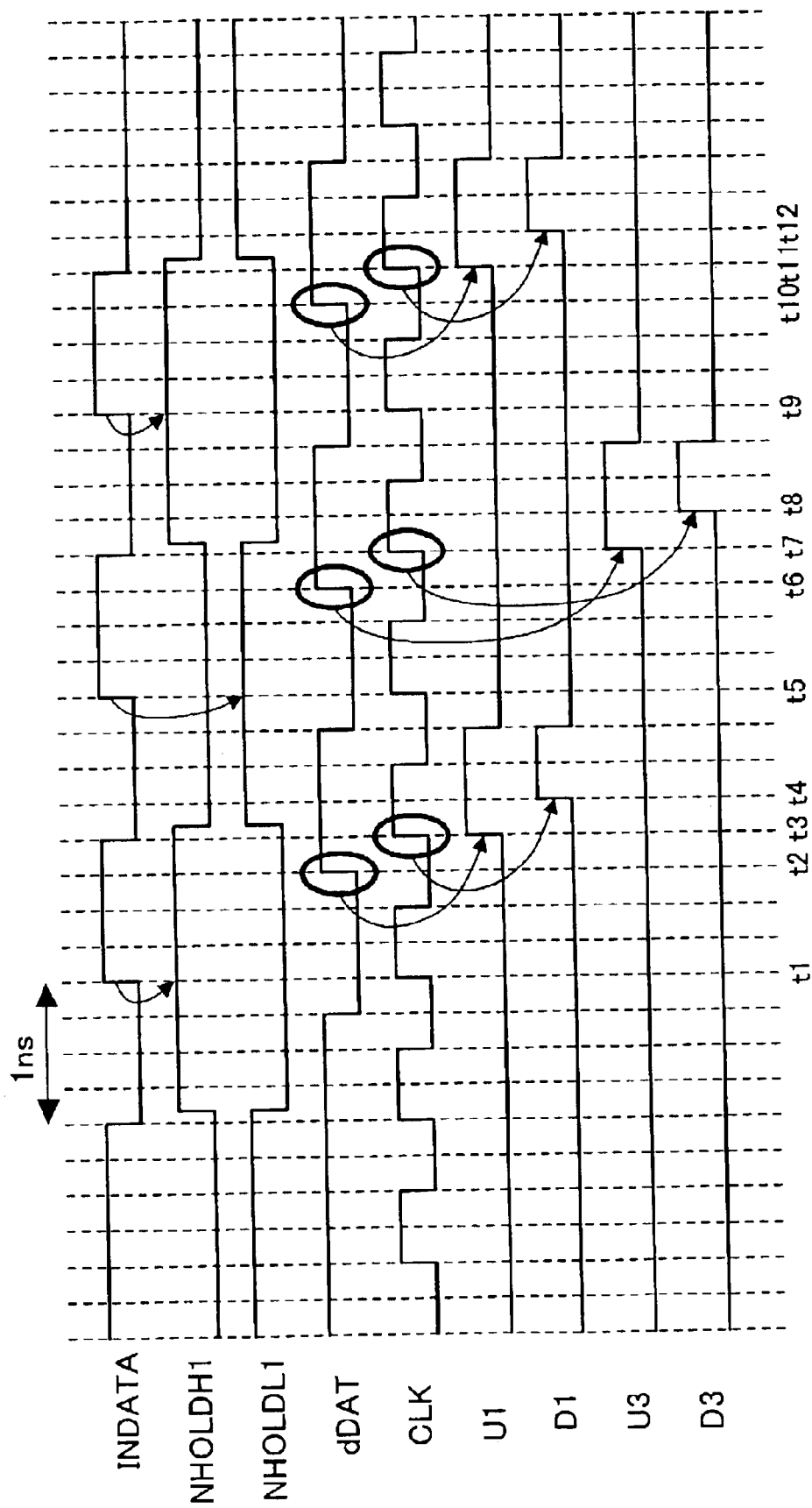
FIG. 14 is a timing chart illustrating the operation of the clock recovery circuit shown in FIG. 13.
Figure 15:
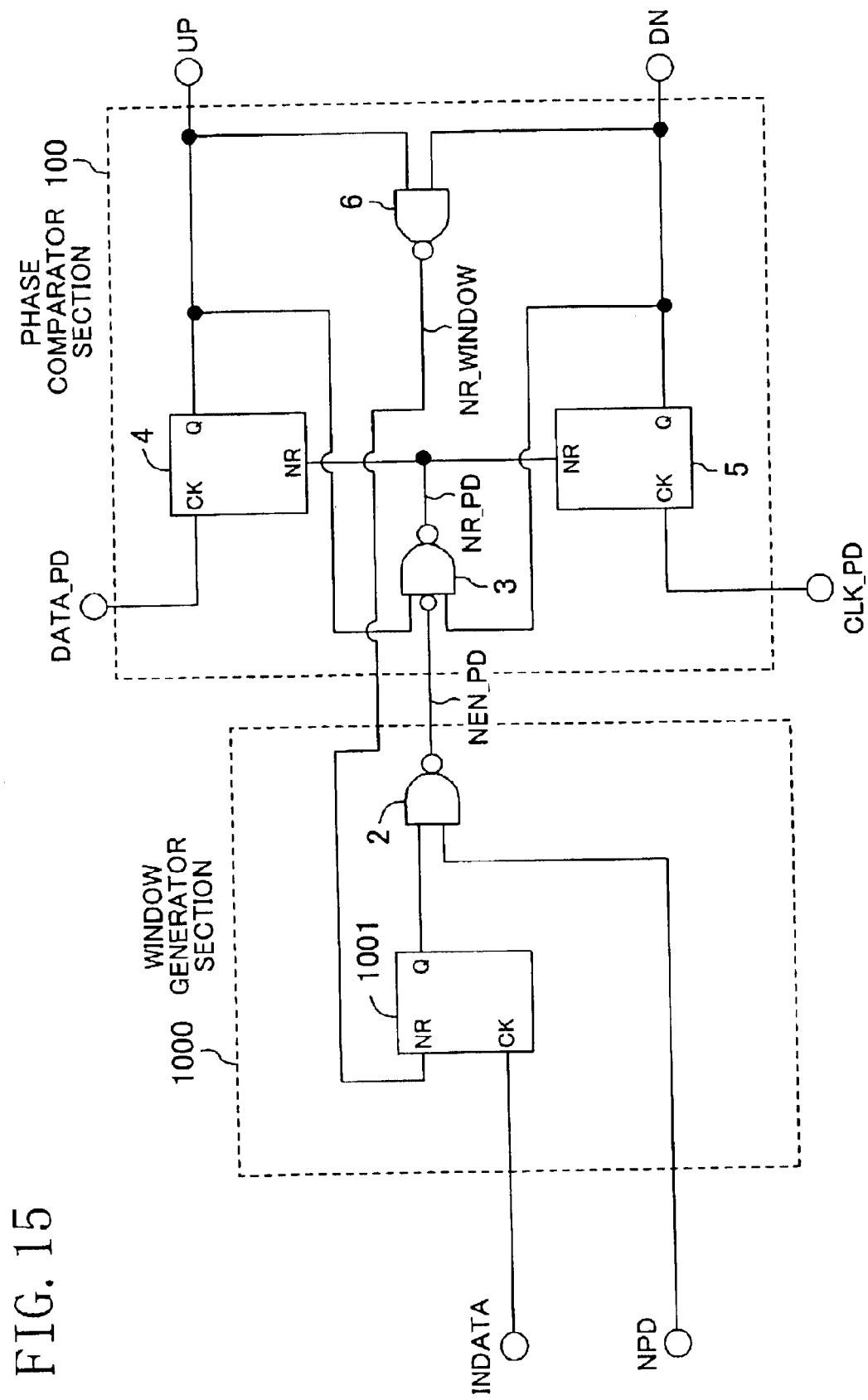
FIG. 15 is a circuit diagram of a conventional phase comparator.
Figure 16:
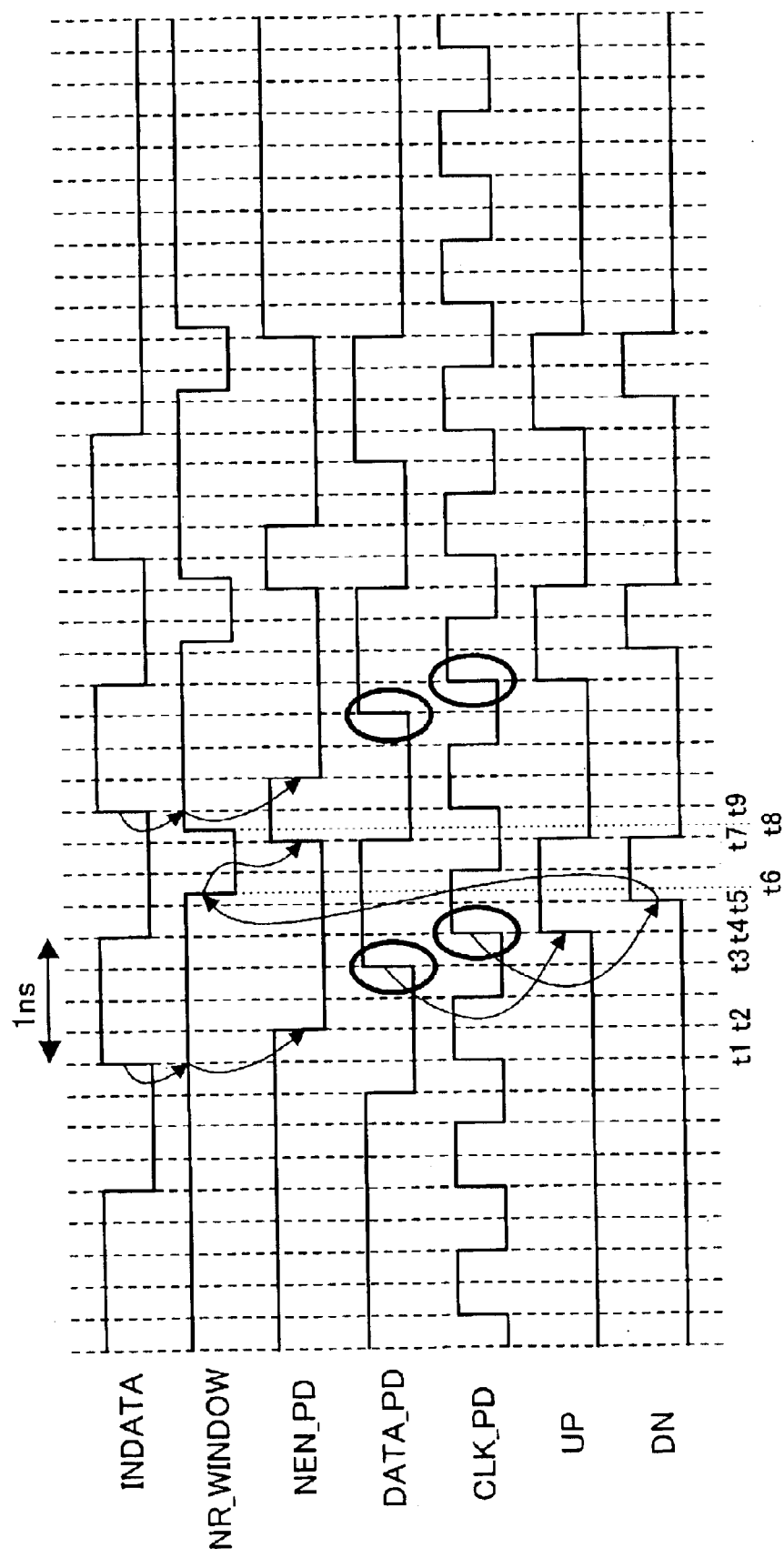
FIG. 16 is a timing chart illustrating the operation of the phase comparator shown in FIG. 15.

Next, with reference to the timing chart shown in FIG. 14, the following describes in detail the operation of the clock recovery circuit according to the present embodiment in the phase comparison mode, especially the operation of the phase comparators 500 and 700.

At time t1, a rise of the signal DAT occurs. At this time, because the input signal NHOLDH1 is at "H", the phase comparator 500 starts the phase comparison between the data signal dDAT and the clock signal CLK. By contrast, the phase comparison 700 does not perform the phase comparison because the input signal NHOLDL1 is at "L".

The phase comparator 500 detects a rise of the data signal dDAT at time t2 and outputs the signal U1 at time t3. It also detects a rise of the clock signal CLK at time t3 and outputs the signal D1 at time t4.

Subsequently, at time t5, the next rise of the signal DAT occurs. At this time, because the input signal NHOLDL1 is at "H", the phase comparator 700 starts the phase comparison between the data signal dDAT and the clock signal CLK By contrast, the phase comparison 500 does not perform the phase comparison because the input signal NHOLDH1 is at "L".

The phase comparator 700 detects a rise of the data signal dDAT at time t6 and outputs the signal U3 at time t7. It also detects a rise of the clock signal CLK at time t7 and outputs the signal D3 at time t8.

Then, at time t6, the next rise of the signal DAT occurs. At this time, because the signal NHOLDH1 is at "H" and the signal NHOLDL1 is at "L", the phase comparator 500 starts the phase comparison this time. Thus, when the phase comparators 500 and 700, each of which intermittently performs the phase comparison, are made to perform the interleaving comparison using the signals NHOLDH1 and NHOLDL1 having differing phases from each other, the phase comparison can be performed for all the rising edges of the signal dDAT.

Likewise, when the phase comparators 600 and 800 are made to perform the interleaving comparison, the phase comparison can be performed for all the rising edges of the signal XdDAT, that is, for all the falling edges of the signal dDAT.

As described above, according to the present embodiment, four phase comparators 500 to 800 are provided, and therefore, the phase comparison can be performed between all the rising edges and falling edges of the signal dDAT and the clock signal CLK. Thus, a clock recovery circuit can be achieved that can support high-speed bit rates and also has excellent jitter resistance.

It should be noted that the signals NHOLDH1, NHOLDL1, NHOLDH2, and NHOLDL2 are described to be frequency divided signals that are obtained by dividing the frequencies their original signals by 2, but they may be the signals obtained by dividing the frequencies of their original signals by 3. For example, in cases where the signals obtained by dividing the frequency of the original signal by 3 are used, if six phase comparators that intermittently perform the phase comparison are employed to perform the phase comparison so that the timing is shifted from each other, it is possible to obtain a configuration that can attain similar effects to those of the present embodiment.

The above-described embodiments of the present invention have described that the phase comparators 500 to 800 perform the phase comparison between the rising edge of the signal CLK and the rising edge of the signal dDAT or the signal XdDAT, but they may perform the phase comparison for the falling edges.

As has been described thus far, according the present invention, the timing margin for the phase comparison can be increased by configuring a phase comparator that performs a phase comparison between a first signal and a second signal that are supplied thereto so that the phase comparator performs the phase comparison according to the logic level of a frequency divided signal generated from the first signal. As a result of this, a phase comparator capable of high-speed operation can be achieved.

In addition, it is possible to achieve a clock recovery circuit suitable for applications that support data signals with high-speed bit rates in the order of one gigabit per second (for example, those typified by IEEE 1394b) by incorporating a phase comparator that intermittently performs the phase comparison in the clock recovery circuit.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A phase comparator performing a phase comparison between a first signal and a second signal that are supplied thereto, comprising:

a phase comparator section performing the phase comparison between the first signal and the second signal; and a window generator section outputting a comparison window signal that controls switching between activating the phase comparator section to perform a phase comparison and inactivating of the phase comparator section to inactivate the phase comparison;

wherein the window generator section receives as input a frequency divided signal derived from the first signal, and sets the window comparison signal to such a state that the phase comparator section is inactivated when the frequency divided signal is at a predetermined logic level.

2. The phase compactor according to claim 1, wherein the window generator section comprises:

an activating unit that receives as input a frequency comparison signal indicating whether a frequency comparison between the first and the second signals is to be performed or not, and fixes the window comparison signal to such a state that the phase comparator section is activated when the frequency comparison signal indicates that the frequency comparison is to be performed.

3. The phase comparator according to claim 1, wherein the window generator section comprises:

a mask unit that receives as input an intermittent comparison signal indicating whether the phase comparison is to be intermittently performed or not, and masks the frequency divided signal when the intermittent comparison signal indicates that the phase comparison is not to be performed intermittently.

4. A clock recovery circuit generating a clock signal from a supplied data signal, comprising:

a frequency divided signal-generating unit that generates a frequency divided signal from the data signal; and a phase comparator that receives as input the frequency divided signal, and intermittently performs a phase comparison between the supplied data signal and the clock signal according to the logic level of the frequency divided signal.

5. The clock recovery circuit according to claim 4, wherein:

the phase comparator receives as input a speed signal indicating the bit rate of the supplied data signal, and selects whether the phase comparison is to be sequentially performed or to be intermittently performed according to the bit rate indicated by the speed signal.

6. The clock recovery circuit according to claim 5, further comprising:

a speed signal-generating unit that compares the frequency of a supplied reference signal and the frequency of an internal signal of the clock recovery circuit, and generates the speed signal based on the result of the comparison.

7. The clock recovery circuit according to claim 4, further comprising:

a charge pump circuit that receives as input a phase difference signal indicating the result of the phase comparison, and outputs a current having an amount that is determined id on the phrase difference signal;

wherein the charge pump circuit receives as input a speed signal indicating a bit rate of the supplied data signal, and changes the amount of the current according to the bit rate indicated by the speed signal.

8. The clock recovery circuit according to claim 7, further comprising:

a speed signal-generating unit that generates a speed signal based on a comparison of a frequency of a supplied reference signal and a frequency of an internal signal of the clock recovery circuit.

9. A clock recovery circuit generating a clock signal from a supplied data signal, comprising:

a frequency divided sigal-generating unit that generates a first frequency divided signal from the data signal and a second frequency divided signal whose phase is different from that of the first frequency divided signal;

a first phase comparator receiving as input the first frequency divided signal, and intermittently performing a phase comparison between a rising edge of the supplied data signal and the clock signal according to a logic level of the first frequency divided signal; and a second phase comparator receiving as input the second frequency divided signal, and intermittently performing a phase comparison between the supplied data signal and the clock signal according to a logic level of the second frequency divided signal.

10. A clock recovery circuit generating a clock signal from a supplied data signal, comprising:

a frequency divided signal-generating unit that generates a first frequency divided signal from the data signal and a second frequency divided signal whose phase is different from that of the first frequency divided signal;

a first phase comparator receiving as input the first frequency divided signal, and intermittently performing a phase comparison between the supplied data signal and the clock signal according to a logic level of the first frequency divided signal; and a second phase comparator receiving as input the second frequency divided signal, and intermittently performing a phase comparison between the supplied data signal and the clock signal according to a logic level of the second frequency divided signal;

wherein the frequency divided signal-generating means generates the second frequency divided signal so that the timing of the phase comparison of the first phase comparator is shifted from the timing of the phase comparison of the second phase comparator.

* * * * *